United States Patent [19]

Sakon et al.

[11] Patent Number: 5,077,142
[45] Date of Patent: Dec. 31, 1991

[54] ELECTROLUMINESCENT DEVICES

[75] Inventors: Yohta Sakon, Numazu; Teruyuki Ohnuma, Shizuoka; Mitsuru Hashimoto, Numazu; Shogo Saito, Fukuoka; Tetsuo Tsutsui, Kasuga; Chihaya Adachi, Onojo, all of Japan

[73] Assignee: Ricoh Company, Ltd., Tokyo, Japan

[21] Appl. No.: 511,407

[22] Filed: Apr. 19, 1990

[30] Foreign Application Priority Data

Apr. 20, 1989 [JP] Japan ................................. 1-102057
Jan. 16, 1990 [JP] Japan ..................................... 2-8006

[51] Int. Cl.⁵ .............................................. H01J 1/62
[52] U.S. Cl. .................................... 428/690; 428/917; 313/504
[58] Field of Search ................ 428/690, 917; 313/504

[56] References Cited

U.S. PATENT DOCUMENTS 4,741,976  5/1988  Eguchi et al. ..................... 428/690
4,769,292  9/1988  Tang et al. ......................... 428/690

Primary Examiner—James J. Seidleck
Attorney, Agent, or Firm—Oblon, Spivak, McClelland, Maier & Neustadt

[57] ABSTRACT

Disclosed herein an electroluminescent device for converting an energy of an electric field applied directly to a light energy and capable of producing surface luminescent for a large area different from conventional incandescent lamps, fluorescent lamps or light emitting diodes.

5 Claims, 1 Drawing Sheet

ELECTROLUMINESCENT DEVICES

BACKGROUND OF THE INVENTION

The present invention relates to organic electroluminescent devices. More in particular, the present invention relates to electroluminescent devices for converting an energy of an electric field applied directly to a light energy and capable of producing surface luminescence for a large area different from conventional incandescent lamps, fluorescent lamps or light emitting diodes.

Electroluminescent devices are grouped into the following two categories depending on the difference of the luminescent excitation system:

(1) an AC driving electroluminescent device in which luminescent material is excited by the local transfer of electrons or holes in a luminescent layer and emits light only by an AC electric field, and (2) a DC driving electroluminescent device in which luminescent material is excited by the injection of electrons and holes from an electrode and this recombination in a luminescent layer and actuated only by a DC electric field.

The AC driving electroluminescent device generally uses, as a luminescent material, an inorganic compound comprising ZnS and Mn, Cu, etc. added thereto, but it involves drawbacks of requiring high AC electric field of higher than 200 V for the driving, much production cost, and insufficient luminance and durability.

On the other hand, the DC driving electroluminescent device uses, as a luminescent layer, a thin film comprising an organic compound, and it has high power conversion efficiency and high luminance.

For instance, Japanese Patent Application Laid-Open (KOKAI) No. 59-194393 (U.S. Pat. No. 4,539,507) discloses an electroluminescent device comprising an anode, a hole transporting zone, an organic luminescent zone and a cathode, in which the total film-thickness for the anode, the hole transporting zone and the organic luminescent zone is less than 1 μm, and at least one of the anode and the cathode allows to permeate at least 80% of radiation rays at a wavelength of not less than 400 nm and has at least $9 \times 10^{-5}$ W/W of power conversion efficiency. As the fluorescent whitening agent of the electron transporting compound forming the organic luminescent zone, there are used, 2,5-bis(5,7-di-t-benzyl-2-benzoxazolyl)-1,3,4-thiadiazole; 4,4'-bis(5,7-t-benzyl-3-benzoxazolyl)stilbene; 2,5-bis(5,7-di-t-benzyl-2-benzoxazolyl)thiophene; 2,2'-(p-phenylenedivinylene)-bis-benzothiazole; 4,4'-bis(2-benzoxazolyl)biphenyl; 2,5-bis(5-(α,α-dimethylbenzyl)-2-benzoxazolyl)thiophene; 4,4'-bis(5,7-di (2-methyl-2-butyl)-2-benzoxazolyl)stilbene; and 2,5-bis(5,7-di-(2-methyl-2-butyl)-2-benzoxazolyl)-3,4-diphenylthiophene.

U.S. Pat. No. 4,720,432 also discloses an electroluminescent device comprising in sequence, an anode, an organic hole injecting and transporting zone, an organic electron injecting and transporting zone, and a cathode, characterized in that the organic hole injecting and transporting zone is comprised of a layer in contact with the anode containing a hole injection porphyrnic compound and a layer containing a hole transporting aromatic tertiary amine interposed between the hole injecting layer and the electro injecting and transporting zone.

Further an electroluminescent device comprising an anode, a hole transporting organic material layer, a luminescent layer, an electron transporting organic material layer and a cathode and emitting yellow light is reported in Jpn. Journal of Applied Physics, Vol. 27, pages 713-715, and there are exemplified N,N'-diphenyl-N,N'-bis(3-methylphenyl)-1,1'-biphenyl-4,4'-diamine as the hole transporting organic material, 3,4,9,10-perylene tetracarbonic acid bisbenzimidazole as the electron transporting organic material and phthaloperinone as the luminescent material.

However, it can not be said that sufficient study has been made on the DC driving electroluminescent device using organic compounds as the luminescent material, with respect to the material and device-forming technique, and there are many problems with respect to the improvement of luminance, the control of wavelength of the emission light, the durability and the increased working life.

As a result of the present inventors' earnest studies in order to provide an electroluminescent device having high luminance and excellent durability with long lasting luminescent performance, and providing versatile wavelength of emission light, capable of accurately selecting luminescent hues such as blue, green and red while considering the application to full color display, it has been found that an electroluminescent device comprising as a luminescent layer at least one layer of an organic compound sandwiched between an anode and a cathode, in which the said organic compound layer comprises an organic compound represented by the following formula (I'), can be driven at a low applied voltage, can provide an emission light of high luminance for a long period, and can accurately select the luminescent hues.

  (I')

(where B' represents:
(1) a cyclic hydrocarbon such as a substituted or unsubstituted cyclobutene, cyclohexene or cyclohexadiene, a substituted or unsubstituted benzene, p-benzoquinone, cyclopentadienone, diphenyl, etc.;
(2) a condensated polycyclic hydrocarbon such as naphthalene, anthracene, naphthacene, phenanthrene, a substituted or unsubstituted indene, indenone, naphthocyclobutene, a substituted or unsubstituted benzocyclohexene, naphthocyclohexene, etc.;
(3) an oxygen heterocycle such as a substituted or unsubstituted furane, benzofuran, isobenzofuran, pyrrone, isonaphthofuran, etc.;
(4) a sulfur heterocycle such as thiophene, isobenzothiophene and isonaphthothiophene, etc.;
(5) a nitrogen heterocycle such as substituted or unsubstituted pyrrole, imidazole, pyridine, pyridazine, pyrazine, pyrimidine, quinoline, quinazoline, triazine, pyrazole, isoindole, etc.;

Ar represents benzene, biphenyl, methoxybenzene or naphthalene;
m is an integer of 1 to 6; and
n is an integer of 1 to 6.

The present invention has been attained based on this finding.

SUMMARY OF THE INVENTION

In an aspect of the present invention, there is provided an electroluminescent device comprising an anode, a cathode and one at least one organic compound layer sandwiched therebetween, in which the said organic compound layer comprises an organic compound, as the constituent ingredient, represented by the following formula (I):

$$(B)_{\overline{m}}(Ar)_n \qquad (I)$$

wherein B represents

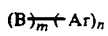

(in which $X^1$ is H, Cl, $CH_3$, $OCH_3$, $C_2H_5$ or CN, and l is 1, 2 or 3)

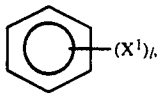

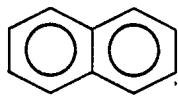

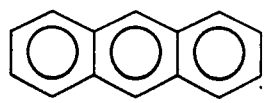

(in which $X^2$ is H or $OCH_3$, and $X^3$ is H, $CH_3$,

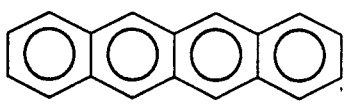

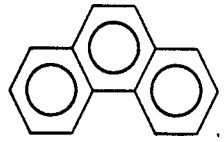

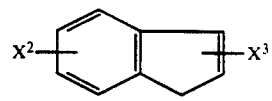

(in which $X^4$ is H or

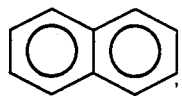

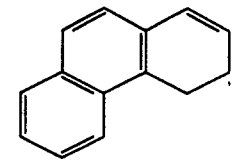

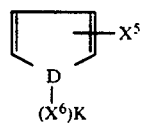

(in which D is O, S, or N,
$X^5$ is H or COOH,
$X^6$ is H, $CH_3$, $C_2H_5$ or

and
κ is 0 or 1)

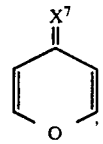

(in which $X^7$ is H or O)

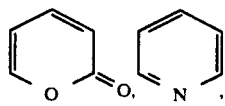

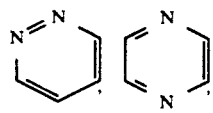

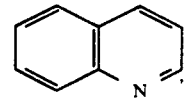

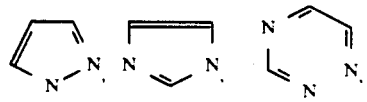

-continued

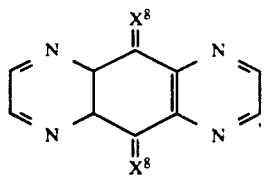

(in which X⁸ is O or C(CN)₂)

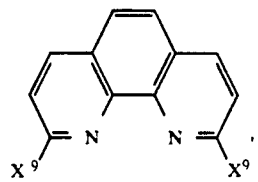

(in which X⁹ is H or CH₃)

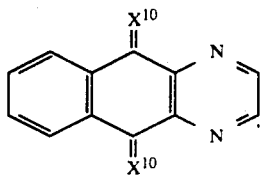

(in which X¹⁰ is O or C(CN)₂)

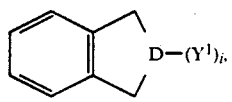

(in which D is O, S or N,
Y¹ is H, and
i is 0 or 1)

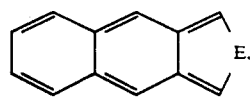

(in which E is O or S)

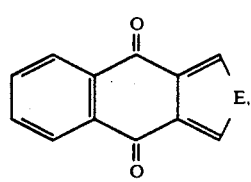

(in which E is O or S)

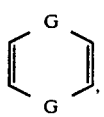

(in which G is S or NH)

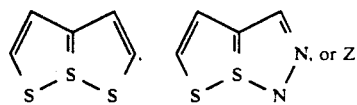, or Z (in which Z represents:
(1) substituted or unsubstituted (C₄–C₆) cycloalkenes containing at least one double bond in the ring,
(2) (C₄–C₆) cycloalkenes having an aromatic ring and containing one double bond in the ring,
(3) 5- or 9-membered heterocycles containing a double bond and at least one oxygen in the ring,
(4) 5-membered heterocycles having an aromatic ring, and containing one oxygen and at least one double bond in the ring,
(5) 6- or 7-membered heterocycles having C₄ or C₆ cycloalkene with at least one double bond, and containing two oxygen atoms in the ring,
(6) C₅, C₆ or C₁₁ heterocycles containing 1 or 2 sulfur atoms in the ring,
(7) 5- or 6-membered heterocycles containing 2 to 4 nitrogen atoms and at least one double bond in the ring,
(8) 5-, 6- or 8-membered heterocycles having an aromatic ring, and containing at least one double bond and 1 or 2 nitrogen atoms in the ring,
(9) 5- or 6-membered heterocycles containing 1 or 2 nitrogen atoms and, optionally, oxygen atom in the ring;
Ar represents

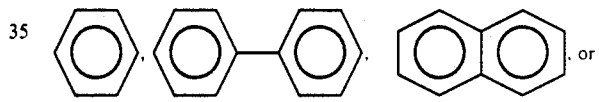

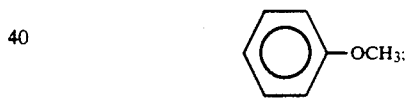

m represents an integer of 1 to 6; and
n represents an integer of 1 to 6.

DETAILED DESCRIPTION OF THE INVENTION

Figure 1:
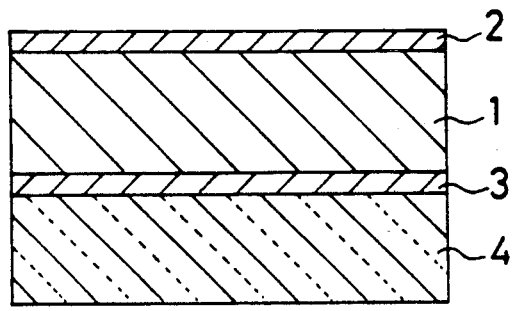
FIG. 1 to FIG. 3 are schematic cross sectional views of an electroluminescent device according to the present invention.

The organic compound consisting a luminescent layer in the electroluminescent device according to the present invention is a compound represented by the formula (I):

 (I)

wherein B represents

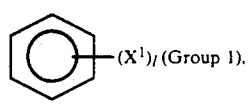 (Group 1).

(in which $X^1$ is H, Cl, $CH_3$, $OCH_3$, $C_2H_5$ or CN, and l is 1, 2 or 3)

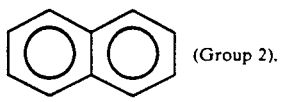 (Group 2),

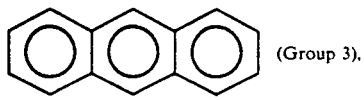 (Group 3),

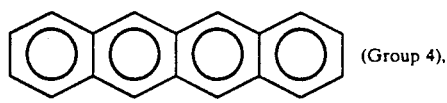 (Group 4),

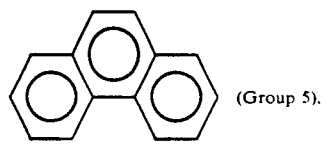 (Group 5),

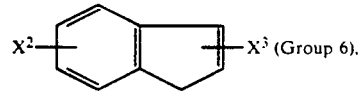 (Group 6), (in which $X^2$ is H or $OCH_3$, and $X^3$ is H, $CH_3$,

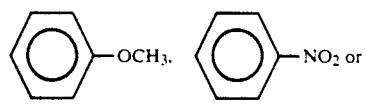

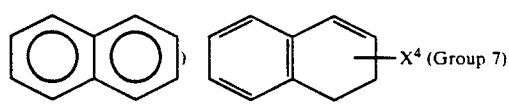 (Group 7)

(in which $X^4$ is H or

)

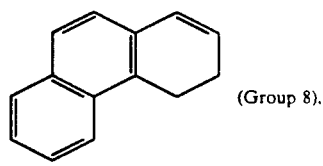 (Group 8),

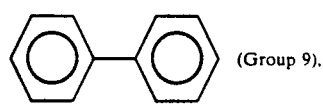 (Group 9),

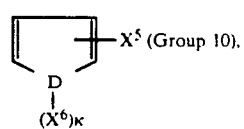 (Group 10), (in which D is O, S, or N,
$X^5$ is H or COOH,
$X^6$ is H, $CH_3$, $C_2H_5$ or

and
κ is 0 or 1)

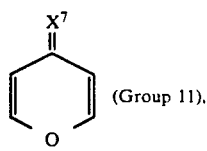 (Group 11), (in which $X^7$ is H or O)

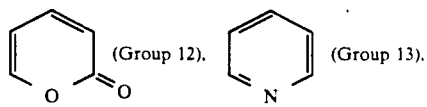 (Group 12), (Group 13),

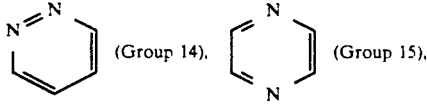 (Group 14), (Group 15),

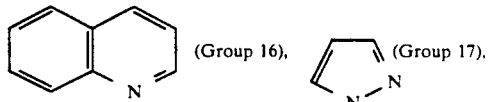 (Group 16), (Group 17),

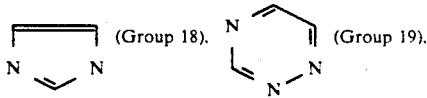 (Group 18), (Group 19),

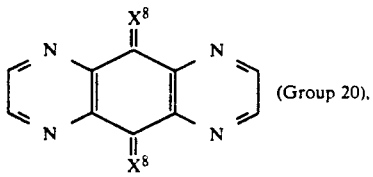 (Group 20), (in which $X^8$ is O or $C(CN)_2$)

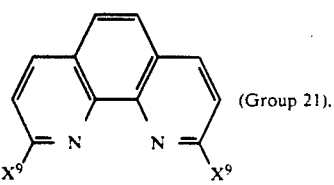 (Group 21), (in which $X^9$ is H or $CH_3$)

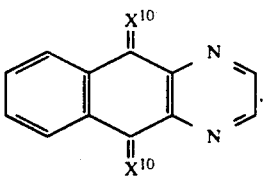

(in which X^10 is O or C(CN)_2)   (Group 22)

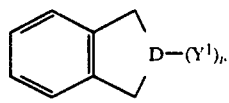   (Group 23)

(in which
D is O, S or N,
Y is H, and
i is 0 or 1)

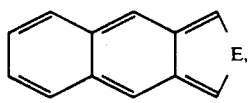   (Group 24)

(in which E is O or S)

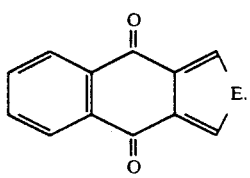   (Group 25)

(in which E is O or S)

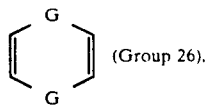   (Group 26).

(in which G is S or NH)

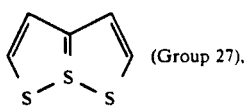   (Group 27).

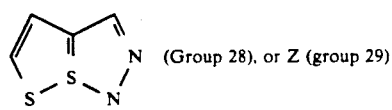   (Group 28), or Z (group 29)

(in which Z represents:
(1) substituted or unsubstituted (C_4–C_6) cycloalkenes containing at least one double bond in the ring,
(2) (C_4–C_6) cycloalkenes having an aromatic ring and containing one double bond in the ring,
(3) 5- or 9-membered heterocycles containing a double bond and at least one oxygen in the ring,
(4) b 5-membered heterocycles having an aromatic ring, and containing one oxygen and at least one double bond in the ring,
(5) 6- or 7-membered heterocycles having C_4 or C_6 cycloalkene with at least one double, bond and containing two oxygen atoms in the ring,
(6) C_5, C_6 or C_11 heterocycles containing 1 or 2 sulfur atoms in the ring,
(7) 5- or 6-membered heterocycles containing 2 to 4 nitrogen atoms and at least one double bond in the ring,
(8) 5-, 6- or 8-membered heterocycles having an aromatic ring, and containing at least one double bond and 1 or 2 nitrogen atoms in the ring,
(9) 5- or 6-membered heterocycles containing 1 or 2 nitrogen atoms and, optionally, oxygen atom in the ring;

Ar represents

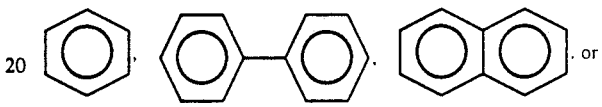, or

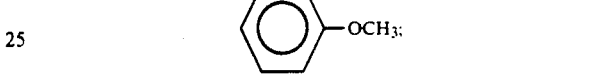;

m represents an integer of 1 to 6; and
n represents an integer of 1 to 6.

As the specific compounds represented by the general formula (I), there can be exemplified compounds Nos. 1–174.

For the substituent B in the formula (I):
the compound belonging to Group 1 includes Nos. 8–11 and 14–20.
the compound belonging to Group 2 includes Nos. 13 and 25–37,
the compound belonging to Group 3 includes Nos. 38–43,
the compound belonging to Group 4 includes Nos. 44–46,
the compound belonging to Group 5 includes Nos. 47–53,
the compound belonging to Group 6 includes Nos. 54–62,
the compound belonging to Group 7 includes Nos. 65–67,
the compound belonging to Group 8 includes Nos. 68 and 69,
the compound belonging to Group 9 includes Nos. 12–21,
the compound belonging to Group 10 includes Nos. 22, 70–75, 96–99 and 111–118,
the compound belonging to Group 11 includes Nos. 85, 86, 91 and 92,
the compound belonging to Group 12 includes Nos. 87–90,
the compound belonging to Group 13 includes Nos. 23, 24 and 126–136,
the compound belonging to Group 14 includes Nos. 137–141,
the compound belonging to Group 15 includes Nos. 143–145,
the compound belonging to Group 16 includes Nos. 150–156 and 158,
the compound belonging to Group 17 includes Nos. 122–123, the compound belonging to Group 18 includes Nos. 119–120, the compound belonging to Group 19 includes Nos. 147–148, the compound belonging to Group 20 includes Nos. 165–166, the compound belonging to Group 21 includes Nos. 161–162, the compound belonging to Group 22 includes Nos. 167–170, the compound belonging to Group 23 includes Nos. 76, 80, 100 and 125, the compound belonging to Group 24 includes Nos. 82–101, the compound belonging to Group 25 includes Nos. 83 and 102, the compound belonging to Group 26 includes Nos. 104 and 142, the compound belonging to Group 27 includes Nos. 106 and 108–110, the compound belonging to Group 28 includes Nos. 171–172, the compounds belonging to Group 29 are respectively as below:

Group 29-1 : Compound Nos. 1–7
Group 29-2 : Compound Nos. 63 and 64
Group 29-3 : Compound Nos. 77 and 78
Group 29-4 : Compound Nos. 79, 81, 84 and 93
Group 29-5 : Compound Nos. 94 and 95
Group 29-6 : Compound Nos. 103, 105 and 107
Group 29-7 : Compound Nos. 121, 124, 146 and 149
Group 29-8 : Compound Nos. 157, 160, 163 and 164
Group 29-9 : Compound Nos. 159, 173 and 174

In the substituent B of the formula (I), compounds belonging to Groups 1 to 9, 13 to 19, 21, 23, 24, 29-1 and 29-2, more preferably Groups 1 to 9, 23, 24, 29-1 and 29-2, most preferably Groups 1 and 6, are preferred.

| Compound No. | Structural formula |
| --- | --- |
| 1 | |
| 2 | |
| 3 | |

| | |
|---|---|
| 4 | 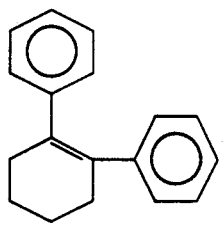 |
| 5 | 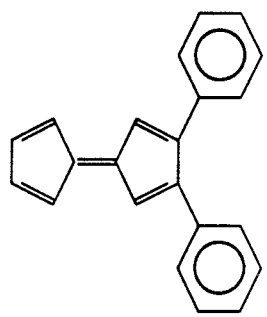 |
| 6 | 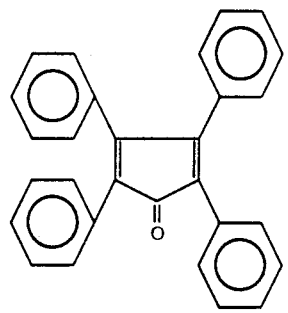 |
| 7 | 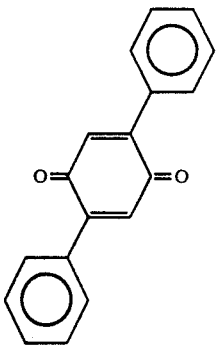 |
| 8 | 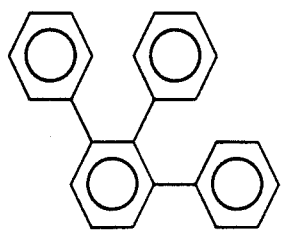 |

-continued
9
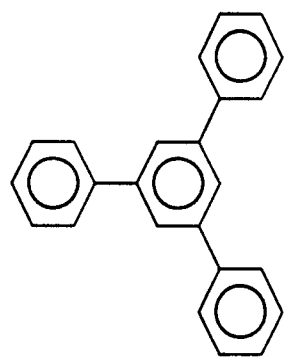
10
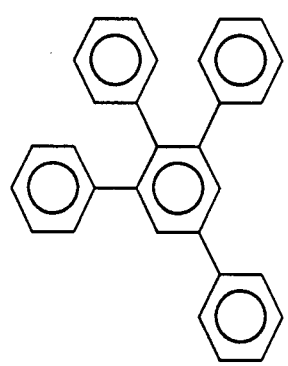
11
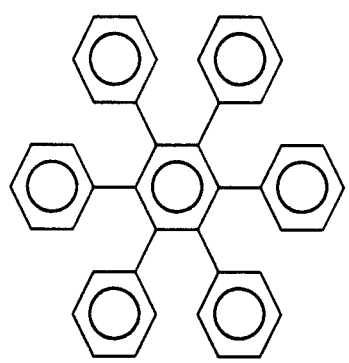
12
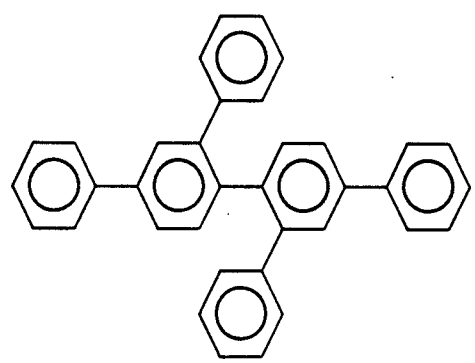

-continued
13
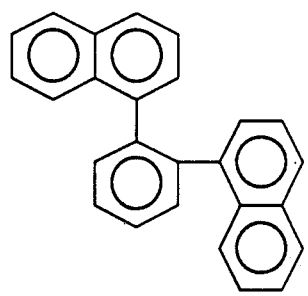
14
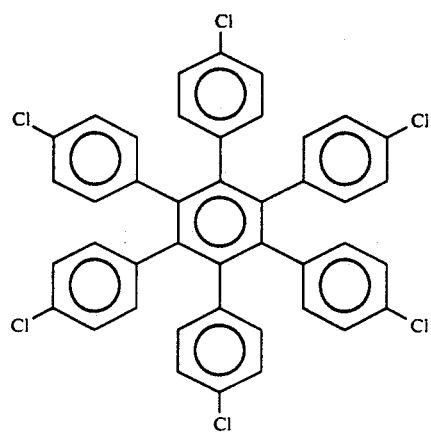
15
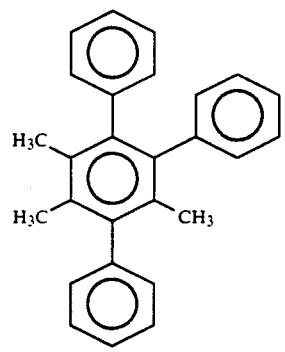
16
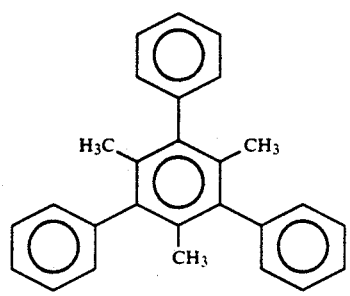

-continued
17
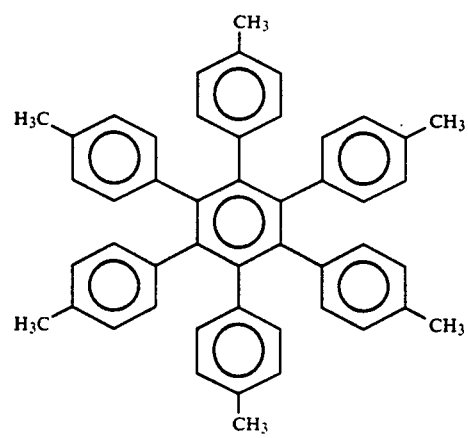
18
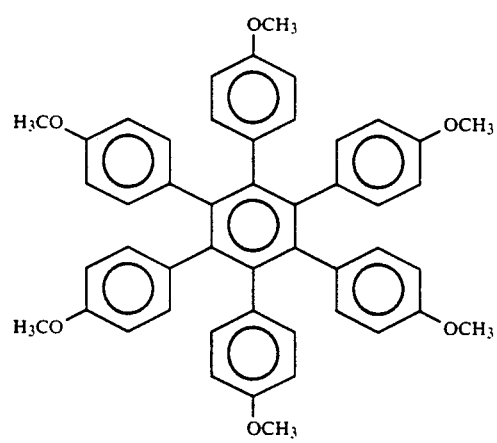
19
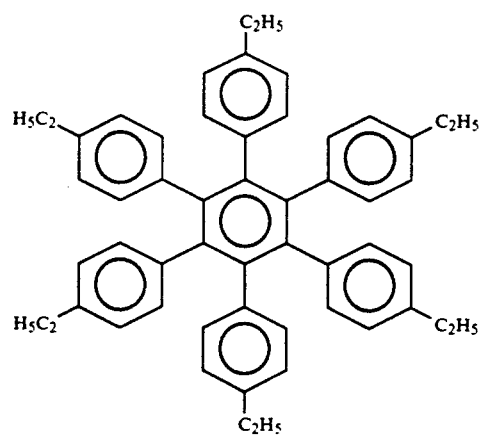

-continued
20
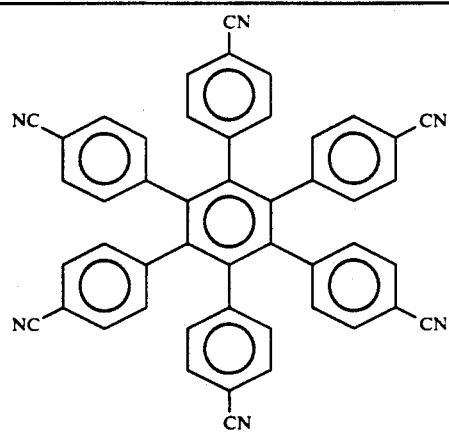
21
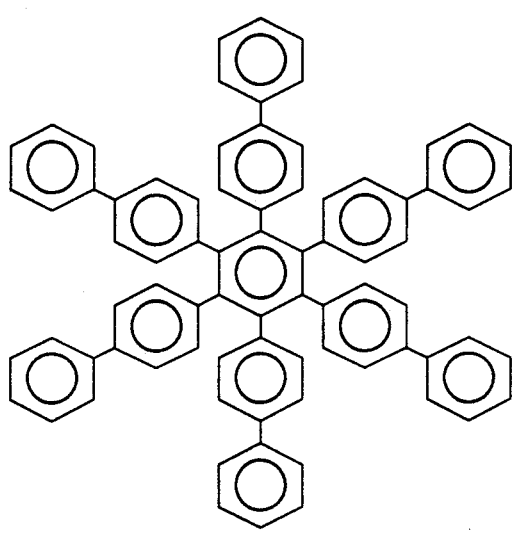
22
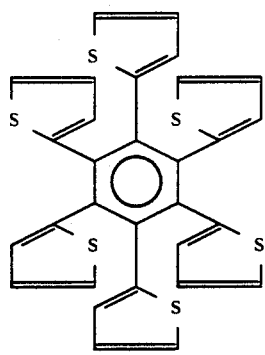
23
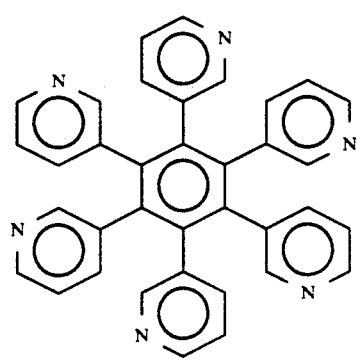

24 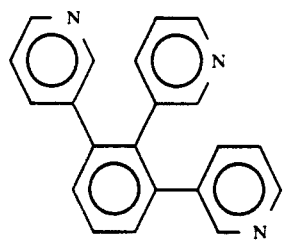
25 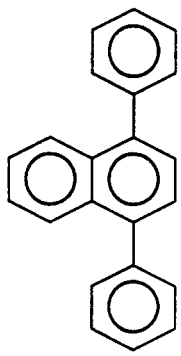
26 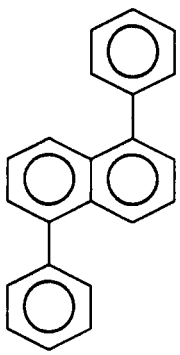
27 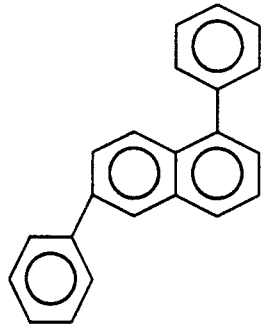
28 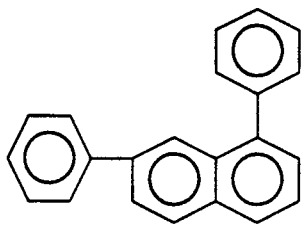

-continued
29 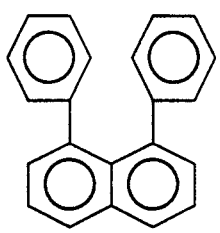
30 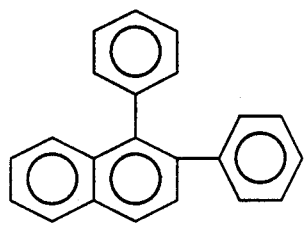
31 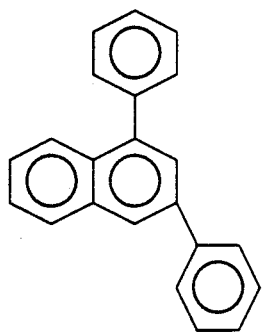
32 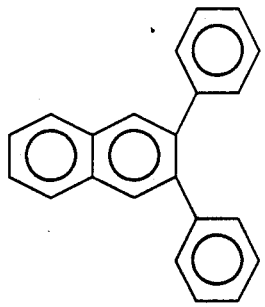
33 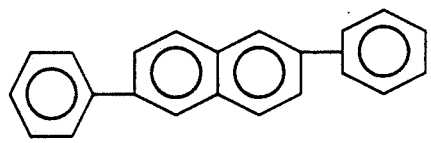
34 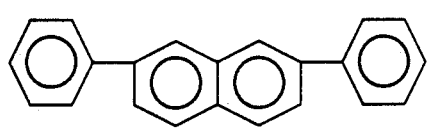

-continued
35
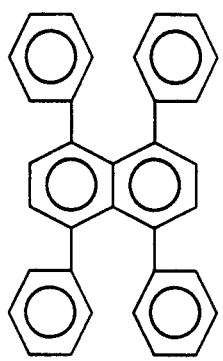
36
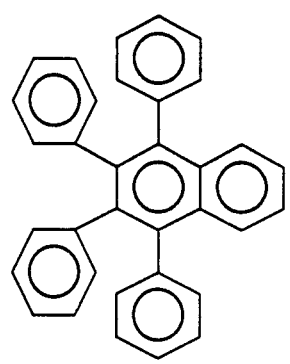
37
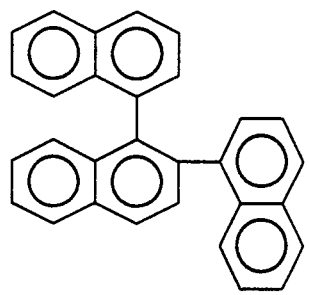
38
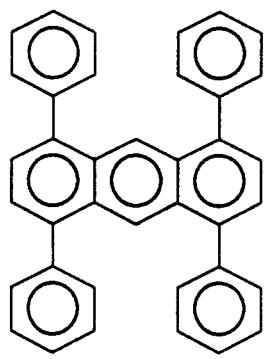

-continued
39
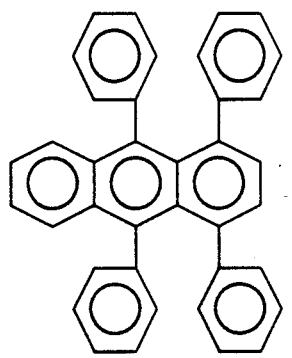
40
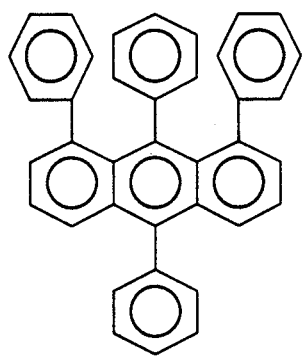
41
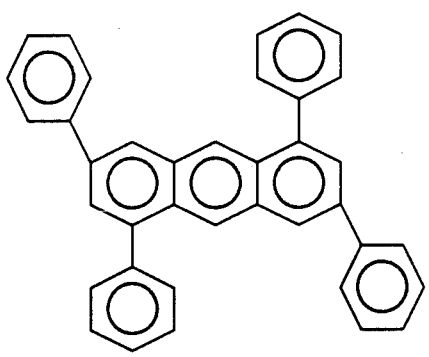
42
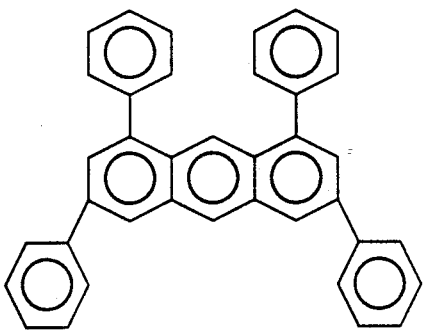

-continued
43
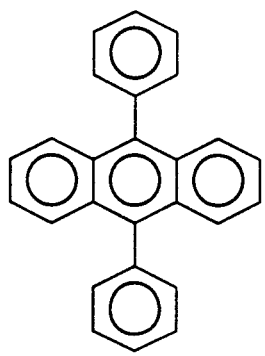
44
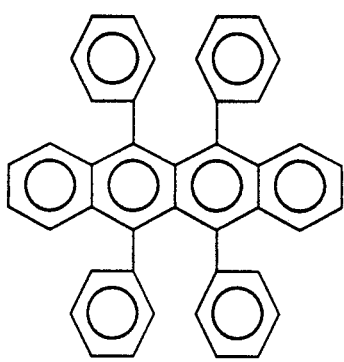
45
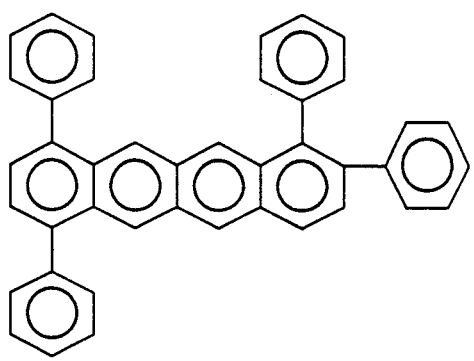
46
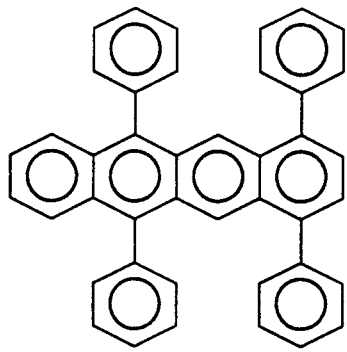

47 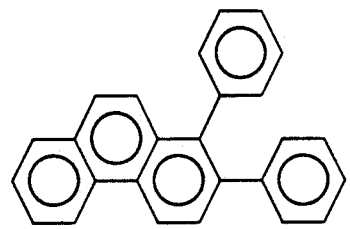
48 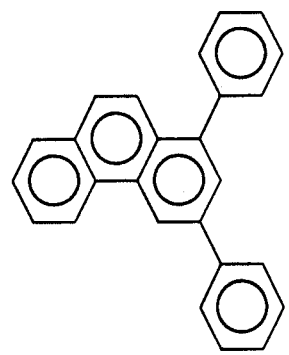
49 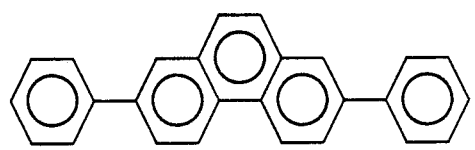
50 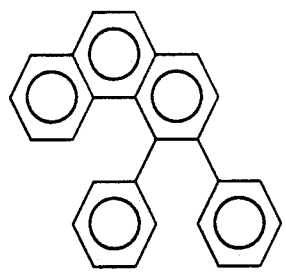
51 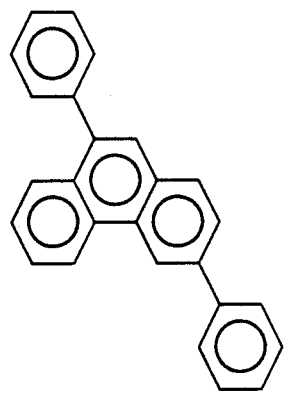

-continued
52
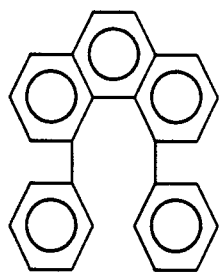
53
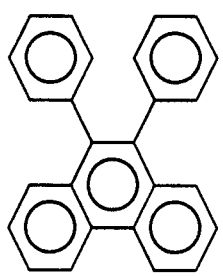
54
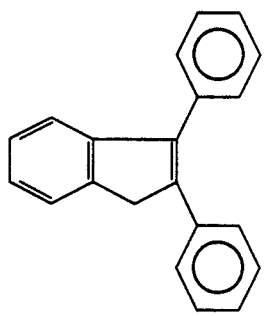
55
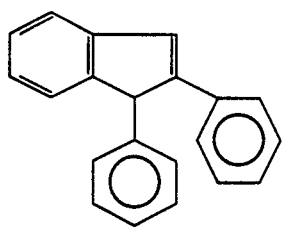
56
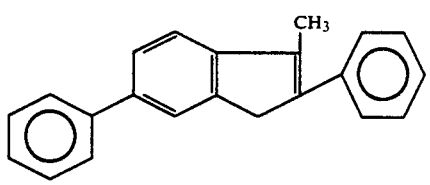
57
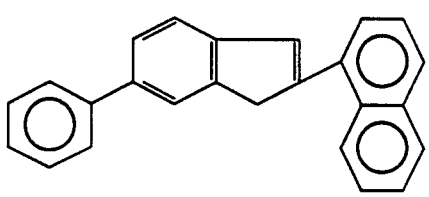
58
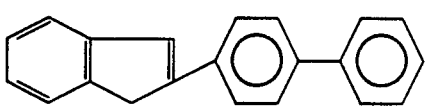

-continued
59
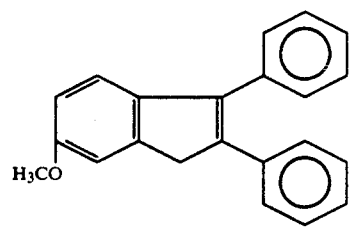
60
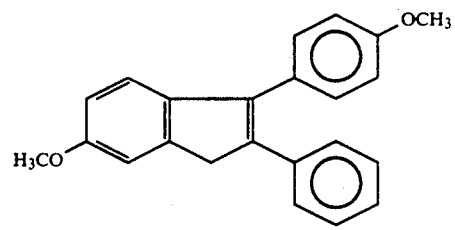
61
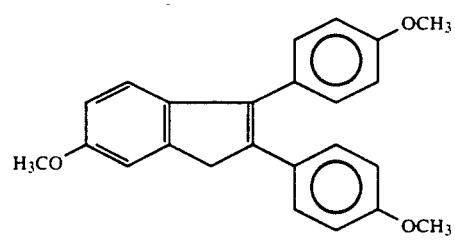
62
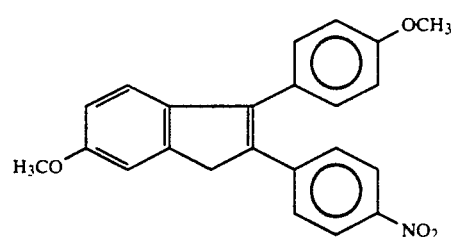
63
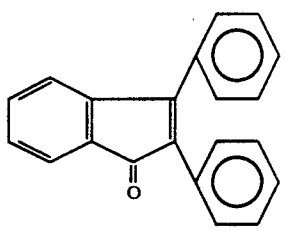
64
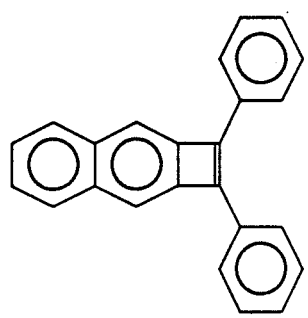

-continued
65
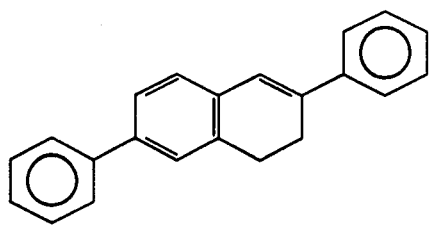
66
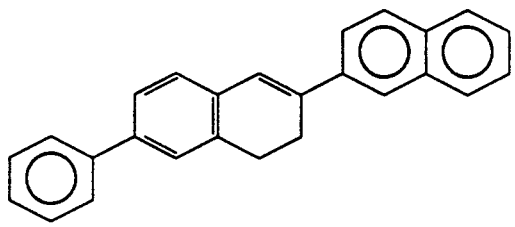
67
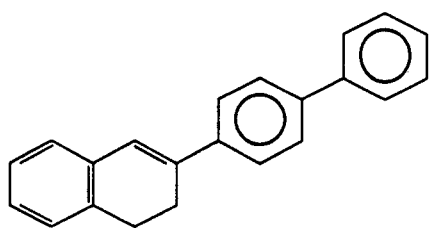
68
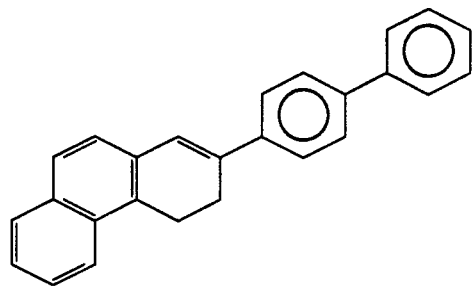
69
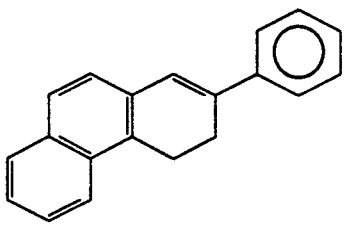
70
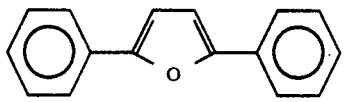
71
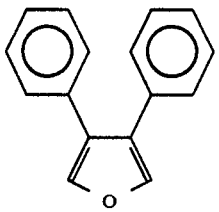

-continued
72 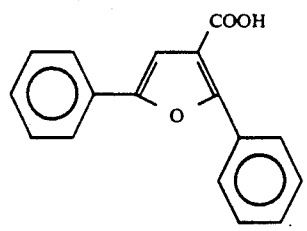
73 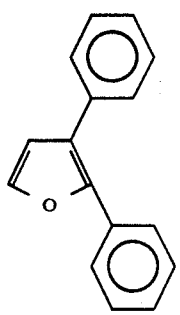
74 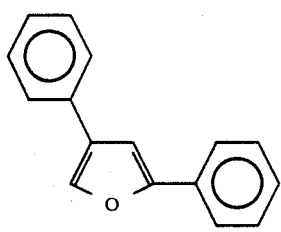
75 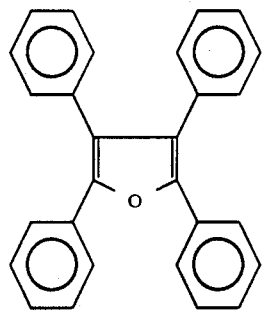
76 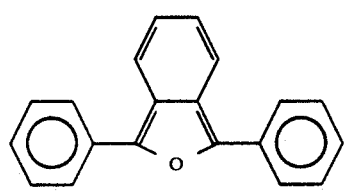
77 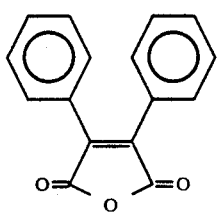

78 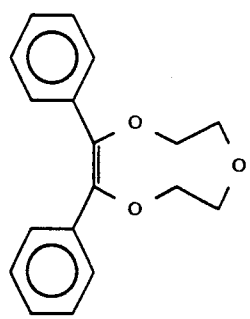
79 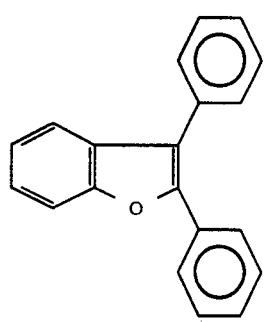
80 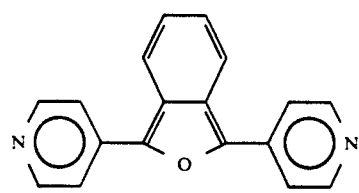
81 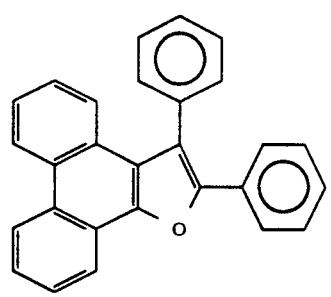
82 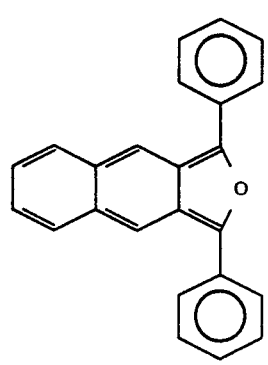

-continued
83
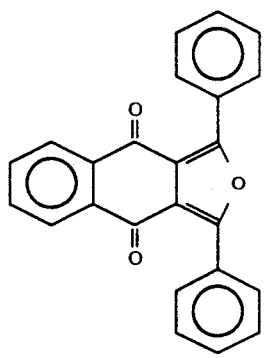
84
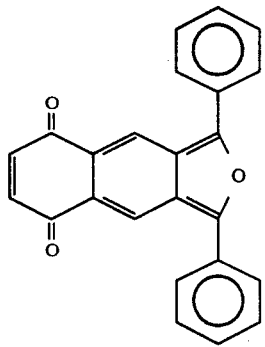
85
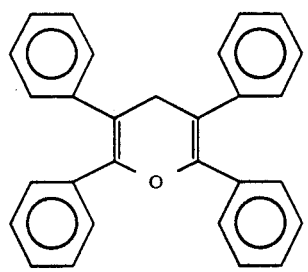
86
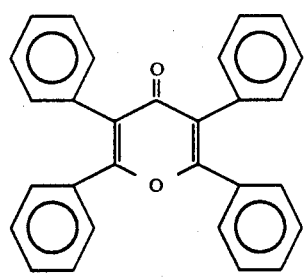
87
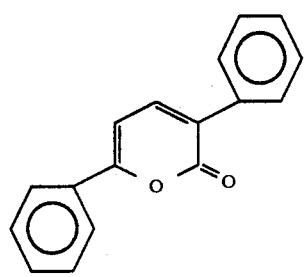

-continued
88
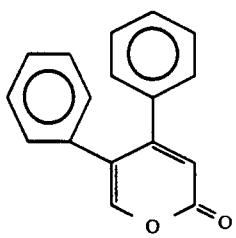
89
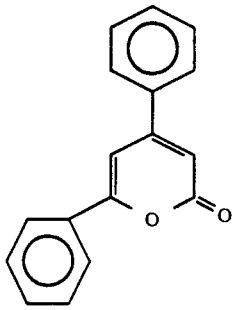
90
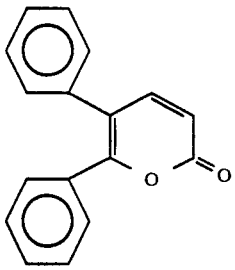
91
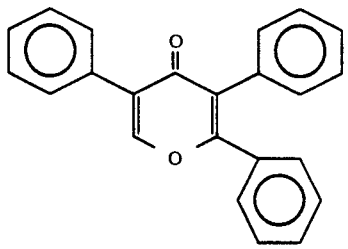
92
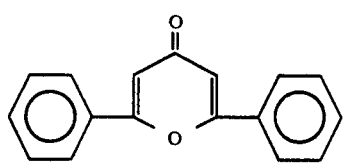
93
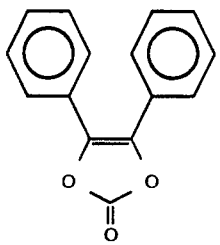

-continued
94
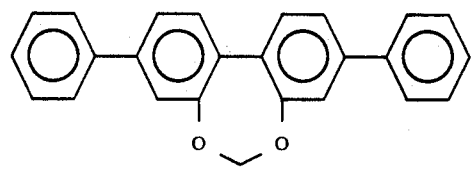
95
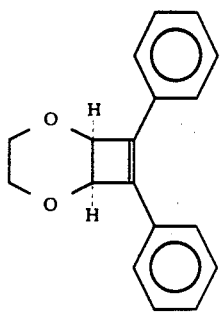
96
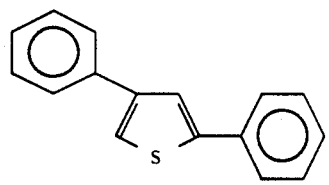
97
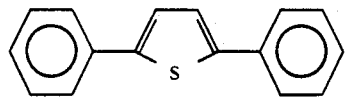
98
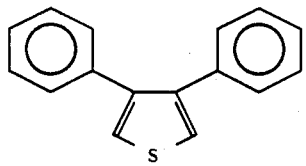
99
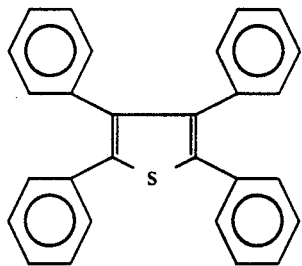
100
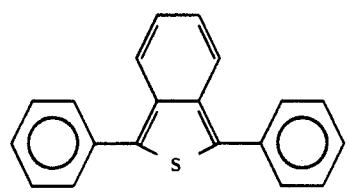

-continued
101
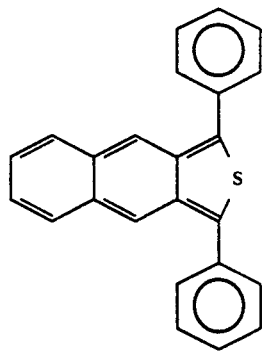
102
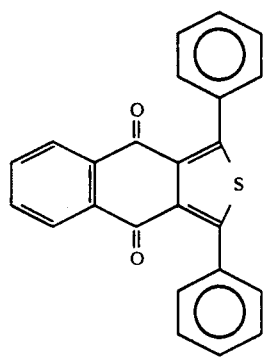
103
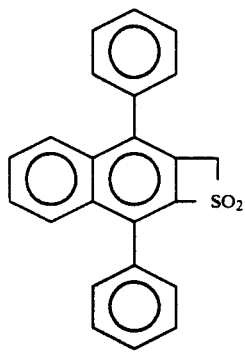
104
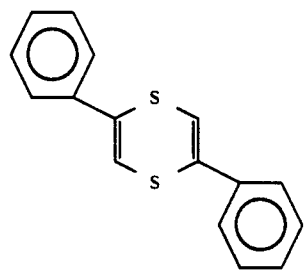

-continued
105
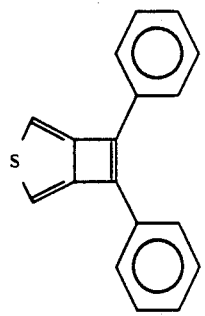
106
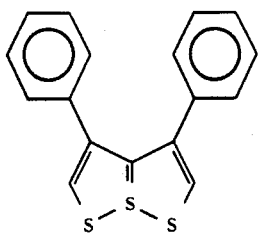
107
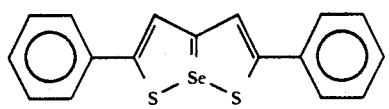
108
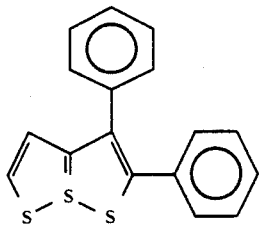
109
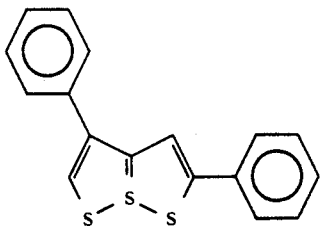
110
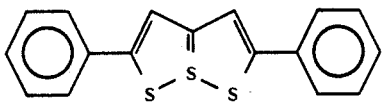
111
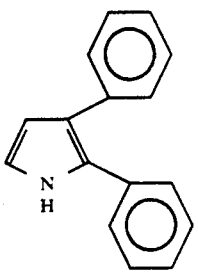

-continued
112
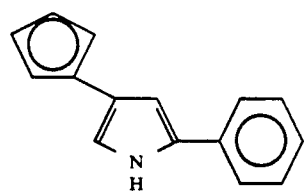
113
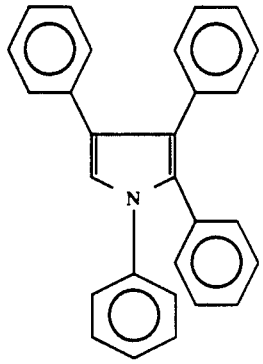
114
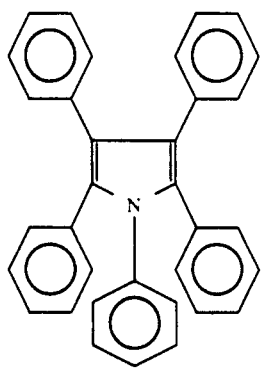
115
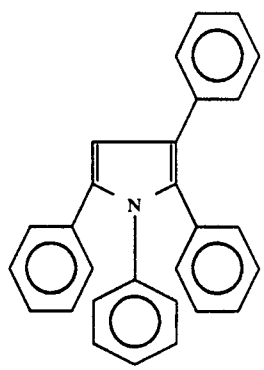
116
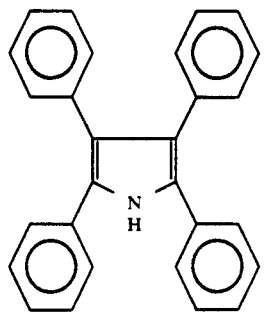

-continued
117 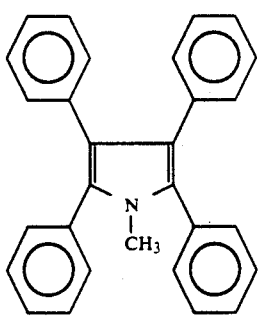
118 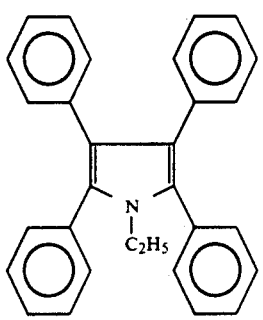
119 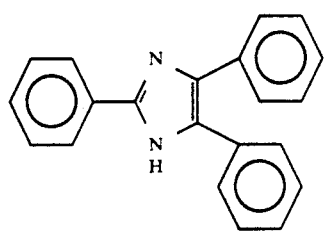
120 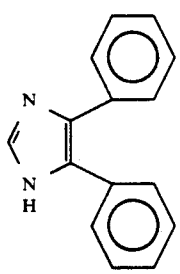
121 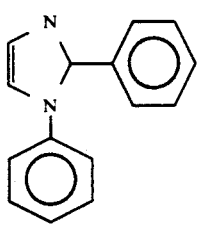
122 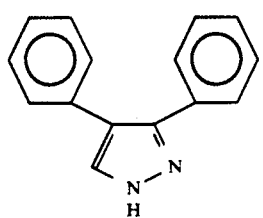

-continued
123 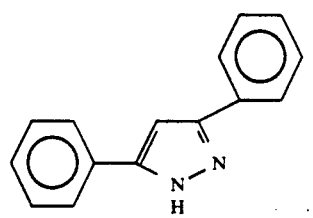
124 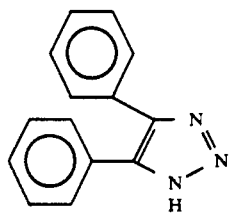
125 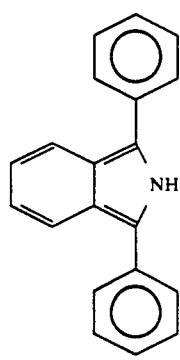
126 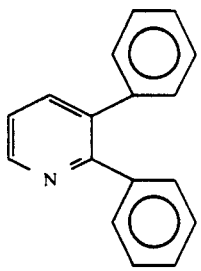
127 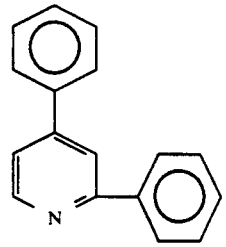
128 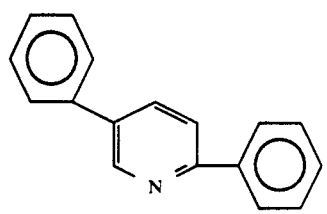

-continued
129 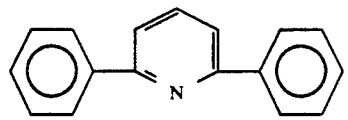
130 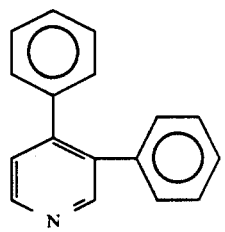
131 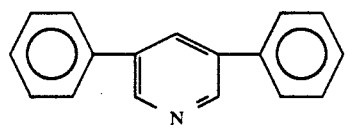
132 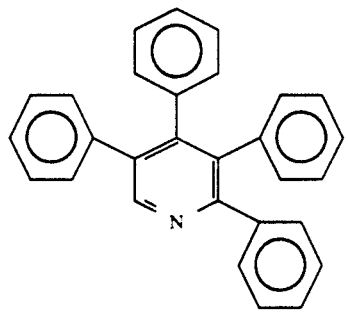
133 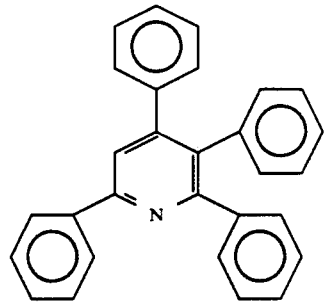
134 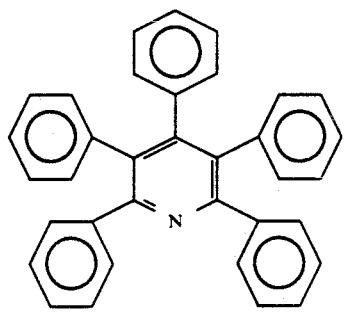

-continued
135
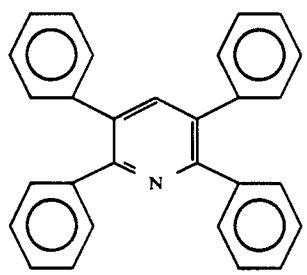
136
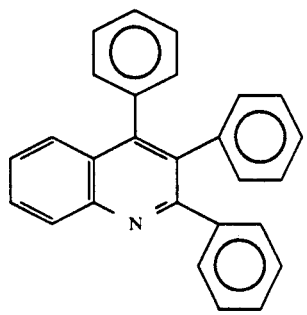
137
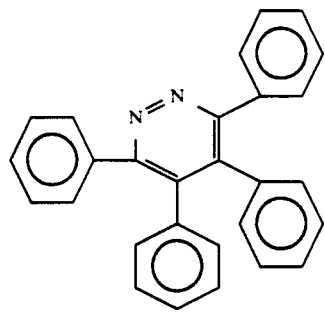
138
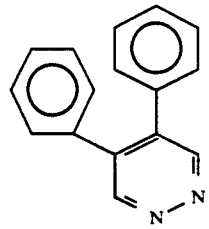
139
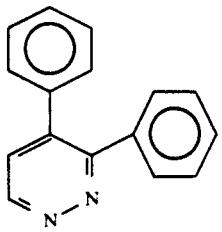

-continued
140
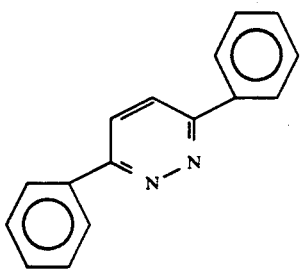
141
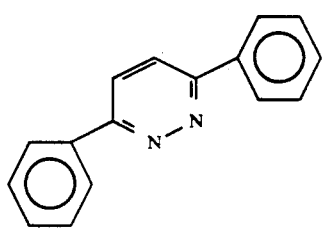
142
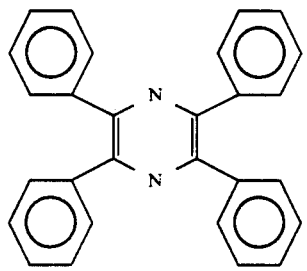
143
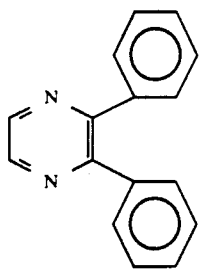
144
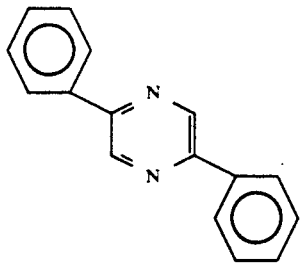
145
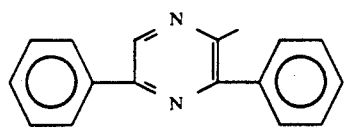

-continued
146
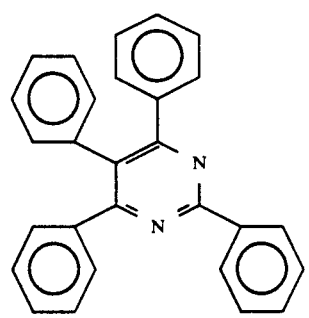
147
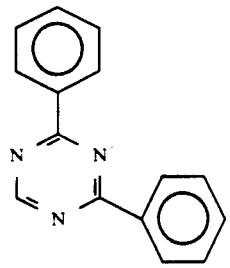
148
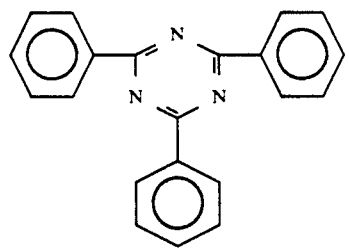
149
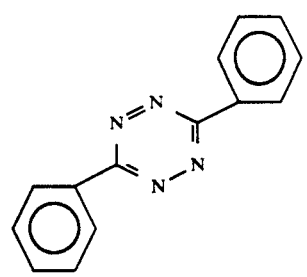
150
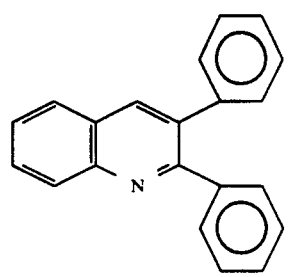

-continued
151
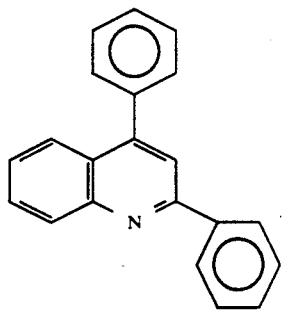
152
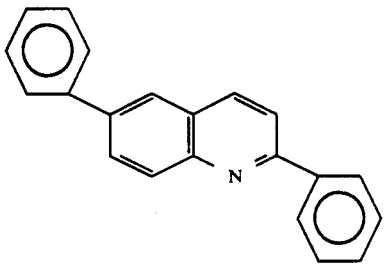
153
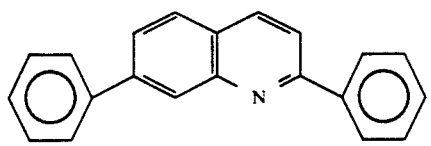
154
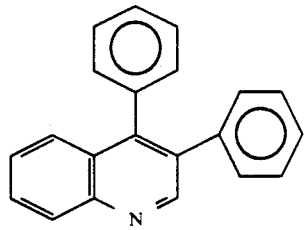
155
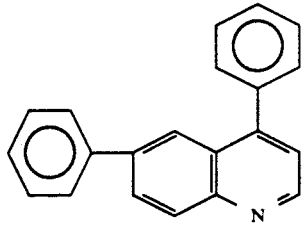
156
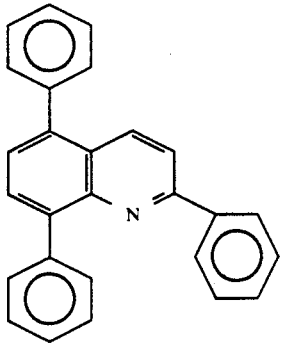

-continued
157
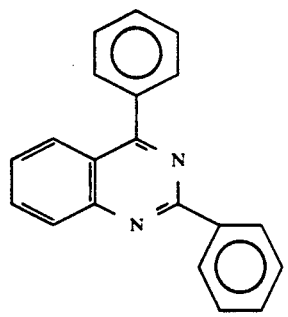
158
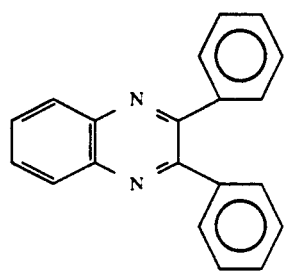
159
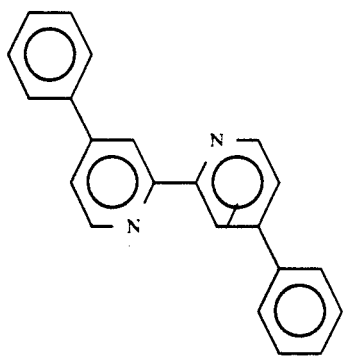
160
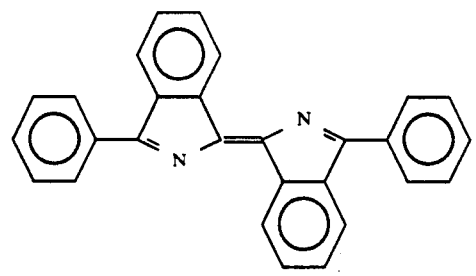
161
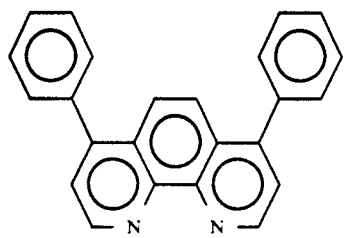

-continued
162
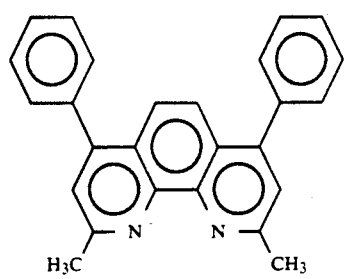
163
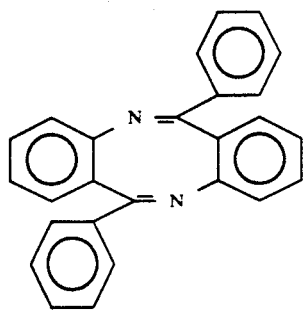
164
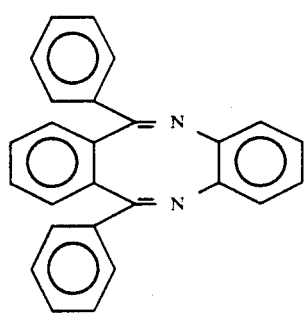
165
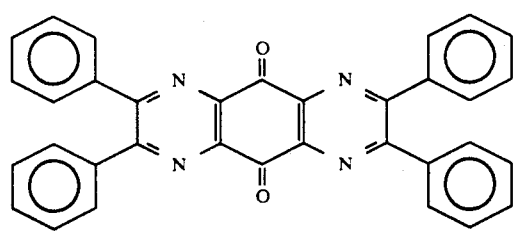
166
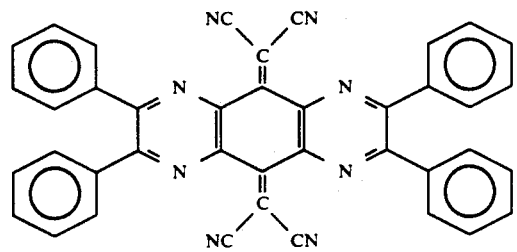
167
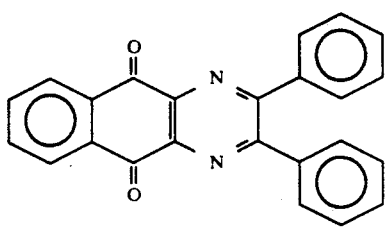

-continued
168
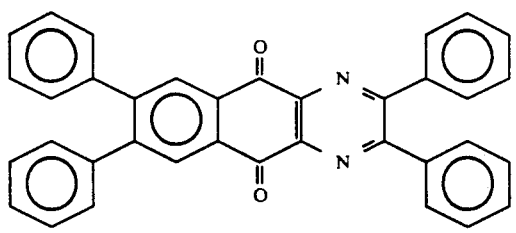
169
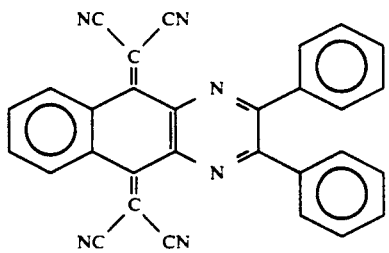
170
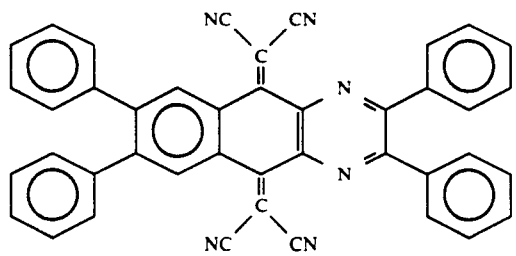
171
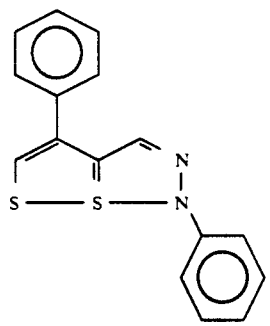
172
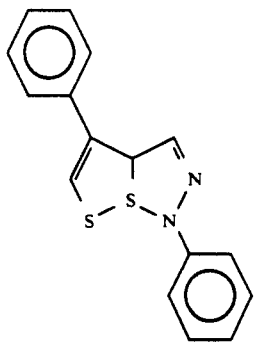
173
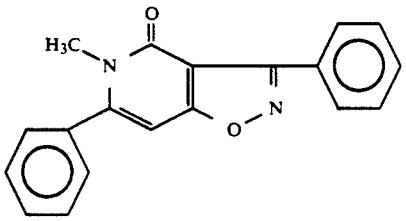

174

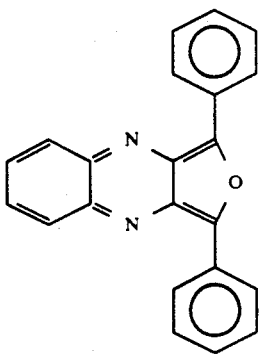

The layer constituting the luminescence (light emission) of the electroluminescent device according to the present invention comprises at least one of the ingredients represented by the formula (I) and, if necessary, may also contain at least one known luminescent material for the stabilization of film crystallization. The layer constituting the luminescence of the electroluminescent device according to the present invention means a luminescent layer, or light-emitting electron transporting layer and hole transporting layer.

The thickness of the layer constituting the luminescence of the present invention is not more than 2 μm, preferably, from 0.05 to 0.5 μm.

For improving the charge injection efficiency from the electrode, a conventional charge injecting and transporting layer can be independently disposed between an anode and a cathode. As the charge injecting and transporting layer, there cen be exemplified a hole transporting layer for properly transporting holes to the cathode when the holes are injected and an electron transporting layer for properly transporting electrons to the anode.

As the electroluminescent device according to the present invention, for example, the electroluminescent device having at least one conventional hole transporting layer, at least one conventional electron transporting layer, or at least one conventional hole transporting layer and at least one conventional electron transporting layer other than the luminescent layer of the present invention may be exemplified.

As the electron transporting substance constituting the conventional electron transporting layer in the present invention, those compounds as disclosed in U.S. Pat. Nos. 4720432 and 4539507 can be used. As preferred conventional electron transporting substance, there can be mentioned aluminum trisoxine, perylene tetracarboxylic acid derivatives.

The thickness of the electron transporting layer of the present invention is not more than 2000 Å.

As the hole transporting substance constituting the conventional hole transporting layer in the present invention, those compounds as disclosed in U.S. Pat. Nos. 4539507 and 4,720,432 can be used. As preferred conventional hole transporting compounds, there can be mentioned those having a hole mobility coefficient of at least $10^{-5}$ cm$^2$/V-sec between electrodes applied with an electric field of $10^4$–$10^6$ V/cm, for example, aromatic amine compound: N,N'-diphenyl-N,N'-bis(3-methylphenyl)-1,1'-biphenyl 4,4'-diamine.

The thickness of the hole transporting layer in the present invention is not more than 2000 Å.

The anode, in the present invention comprises metal of great work function, alloys or compounds thereof, electroconductive polymers of great work function, etc. As specific examples, there can be mentioned nickel, gold, platinum and palladium and alloys thereof, tin oxide (SnO$_2$), indium-tin oxide (ITO), copper iodide, poly(3-methylthiophene), polypyrrole, etc.

The thickness of the anode of the present invention is from 100 to 5000 Å, preferably, 200 to 2000 Å.

For the cathode in the present invention, metals of small work function may be used. For example, silver, tin, lead, magnesium, manganese and aluminum or alloys thereof may be used. The thickness of the cathode of the present invention is not less than 500 Å.

It is preferable that at least one of substances used for the anode and the cathode has a sufficient transparency in the region of a luminous wavelength (light emitting wavelength) of the device. Specifically, it is preferable that the substance has a light transmittance of not lower than 80%.

The electroluminescent device according to the present invention is manufactured by successively laminating the respective layers described above on a transparent substrate such as glass in accordance with a customary method. For instance, the luminescent layer (organic compound layer) in the present invention is prepared by forming the foregoing compounds into thin films by means of vacuum vapor deposition, solution coating, etc.

For the improvement of the stability, particularly, for the protection against moisture in air of the device, there may be mentioned a method of laminating a protecting layer, or a method of placing the entire device into a cell and sealing silicon oil, etc. therein.

In a case where the compound used has hole transporting property, electron transporting property and luminescent property by itself, or compounds having respective property are used in admixture, a constitution as shown in FIG. 1 (1: luminescent layer, 2: cathode, 3: anode and 4: substrate) can be taken.

Figure 2:
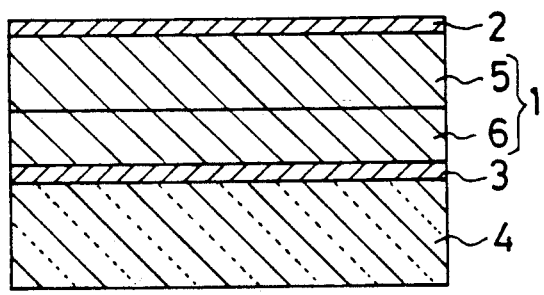

FIG. 2 (1: luminescent layer, 2: cathode, 3: anode, 4: substrate, 5: electron transporting compound layer and 6: hole transporting compound layer) shows a constitution in which a luminescent layer 1 is formed by the combination of a hole transporting compound layer 6 and an electron transporting compound layer 5. Preferred properties of organic compounds are combined in this constitution, intended for the development of a device of excellent luminescence property in which holes or electrons can be transported smoothly from the electrode by the combination of layers of excellent hole transporting compound and/or electron transporting compound. Either one of the compound layers emits light depending on the combination of the compound layers.

Figure 3:
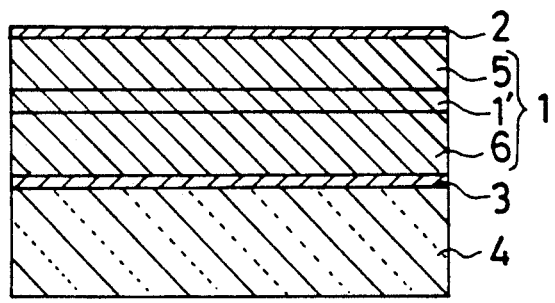

FIG. 3 (1: luminescent layer, 1': luminescent compound layer, 2: cathode, 3: anode, 4: substrate, 5: electron transporting compound layer and 6: hole transporting compound layer) shows a structure in which a luminescent layer 1 is formed by the combination of a hole transporting compound layer 6, a luminescent compound layer 1' and an electron transporting compound layer 5, which is based on an improvement for the concept of the function separation described above. By the function separation the selection for the compounds facilitates while taking notice of the hole transporting, electron transporting and luminescent properties, and as a result a wide range of compounds can be used and the versatility of the wavelength of luminescence is increased. Any of the organic compounds according to the present invention is excellent in luminescent property and can be constituted, as occasion demand, as shown in FIGS. 1, 2 and 3.

Further, the compound represented by the formula (I) according to the present invention is excellent in the hole transporting property or the electron transporting property depending on B, Ar in the formula (I). Accordingly, two or more kinds of compounds according to the present invention may be used in the constitution as shown in FIGS. 2 and 3.

The electroluminescent device according to the present invention emits light under the application of an electric bias to the luminescent layer, but even slight pinholes, if any, will cause short circuit making the device to function no more. Accordingly, it is desired to use a compound of excellent film-forming property for constituting the luminescent layer and, if necessary, the luminescent layer may be formed in combination with a compound of good film-forming property, for example, a polymer binder. As the polymer binder usable herein, there can be exemplified polystyrene, polyvinyl toluene, poly-N-vinyl carbazole, polymethyl methacrylate, polymethyl acrylate, polyester, polycarbonate and polyimide.

In the electroluminescent device according to the present invention, since the compound represented by the formula (I) is used as the material for constituting the luminescent layer, light-emission at high luminance can be obtained for a long period even with a low driving voltage. The electroluminescent devices according to the present invention emits light of various tones by using the compounds according to the present invention.

Further, since in the present invention the devices can easily be prepared by means of vacuum vapor deposition, etc. there is provided a merit that inexpensive devices of large area can be produced efficiently.

EXAMPLES

The present invention will be more precisely explained while referring to Examples as follows.

However, the present invention is not restricted to examples under mentioned. From the foregoing description, one skilled in the art can easily asserting the essential characteristics of the present invention, and without departing from the spirit and scope thereof, can make various changes and modifications of the invention to adapt it to various usages and conditions.

EXAMPLE 1

A device was manufactured by forming an anode sized 3 mm×3 mm, 500 Å in thickness comprising indium tin oxide (ITO) on a glass substrate, and forming, thereover, a hole transporting layer of 500 Å in thickness comprising a benzidine derivative represented by the following formula (a), a luminescent layer of 1000 Å in thickness comprising the compound No. 8 described above and an anode of 1500 Å in thickness comprising silver-magnesium alloy (silver: 7.7 atm %, and purity: 99.9%) respectively by means of vacuum vapor deposition. The vacuum degree was about $1 \times 10^{-6}$ Torr and the substrate temperature was at a room temperature upon vapor deposition. A DC power source was connected by way of lead wires to the anode and the cathode of the thus manufactured device and, when 30 V of voltage was applied, a current density of 70 mA/cm$^2$ flowed to the device and clear blue luminescence was confirmed for a long period.

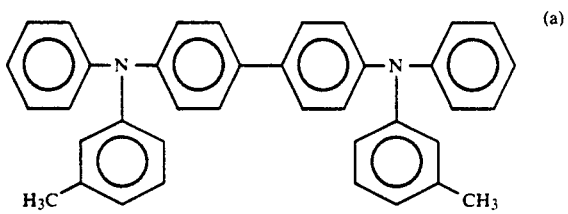

(a)

In this example, the compound (No. 8) according to the present invention functioned as electron transporting and luminescent material.

EXAMPLE 2-5

Devices were manufactured in the same manner as in Example 1 except for using the compounds shown below instead of the compound No. 8 used in Example 1. The results thereof are set forth below.

| Example No. | Compound No. | Tone of emitted light |
| --- | --- | --- |
| 2 | No. 162 | blue |
| 3 | No. 77 | blue |
| 4 | No. 63 | yellow |
| 5 | No. 62 | yellow |

EXAMPLE 6

A device was manufactured in the same manner as in Example 1 except for using the compound No. 9 as the ingredient for forming the luminescent layer and the perylene derivative represented by the following formula (b) as the ingredient for forming the electron transporting layer. The film thickness of the electron transporting layer was 500 Å. When the device was driven in the same manner as in Example 1, a current of 30 mA/cm$^2$ flowed to the device under a voltage of 20 V, and clear blue luminescence was observed for long period.

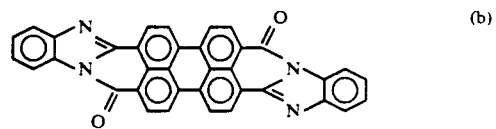

(b)

In this example, the compound (No. 9) according to the present invention functioned as hole transporting and luminescent material.

EXAMPLES 7-10

Devices were manufactured in the same manner as in Example 6 except for using the compounds shown below instead of the compound No. 9 used in Example 6. The results thereof are set forth below.

| Example No. | Compound No. | Tone of emitted light |
| --- | --- | --- |
| 7 | No. 10 | blue |
| 8 | No. 11 | blue |
| 9 | No. 44 | orange |
| 10 | No. 65 | blue |

EXAMPLE 11

Using the substrate having an anode as in Example 1, a luminescent layer of 1000 Å in thickness comprising the compound No. 9 and a silver-magnesium alloy layer of 1500 Å in thickness as the cathode were respectively formed on the anode under the same conditions as described above by means of vacuum vapor deposition. When the device was driven in the same manner as in Example 1, a current of 20 mA/cm² flowed to the device at a voltage of 20 V, and clear blue luminescence was observed for long period.

In this example, the compound (No. 8) according to the present invention functioned as a luminescent layer.

EXAMPLES 12

A device was manufactured in the same manner as in Example 11 except for using the compound No. 119 instead of the compound No. 9 used in Example 11. The result thereof is set forth below.

| Example No. | Compound No. | Tone of emitted light |
| --- | --- | --- |
| 12 | No. 119 | blue |

EXAMPLE 13

A device was manufactured by using the substrate having an anode as in Example 1 and then vapor-depositing under vacuum, on the anode, a hole transporting layer of 600 Å in thickness comprising a triphenylamine derivative represented by the following formula (c), a luminescent layer of 600 Å in thickness comprising the compound No. 120, an electron transporting layer of 600 Å in thickness comprising perylene derivative represented by the formula (b) and a silver-magnesium alloy as the cathode were successively formed under the same conditions as those in Example 1. When the device was driven in the same manner as in Example 1, a current of 20 mA/cm² flowed to the device at a voltage of 30 V and blue luminescence was observed for a long period.

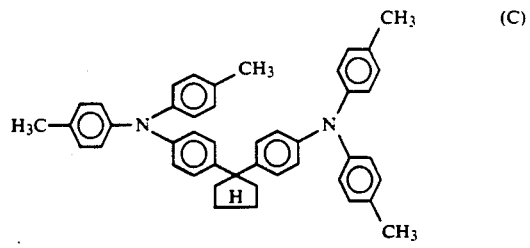

EXAMPLES 14-15

Devices were manufactured in the same manner as in Example 13 except for using the compounds shown below instead of the compound No. 120 used in Example 13. The results thereof are set forth below.

| Example No. | Compound No. | Tone of emitted light |
| --- | --- | --- |
| 14 | No. 159 | blue |
| 15 | No. 57 | blue |

What is claimed is:

1. An electroluminescent device comprising an anode, a cathode and one or a plurality of organic compound layers sandwiched therebetween, in which said organic compound layers comprise an organic compound, as the constituent ingredient, represented by the following formula (I):

wherein B represents

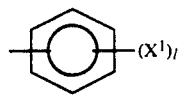

(in which $X^1$ is H, Cl, $CH_3$, $OCH_3$, $C_2H_5$ or CN, and l is 1, 2 or 3),

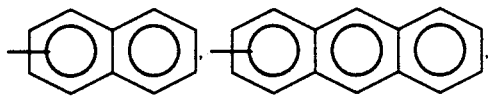

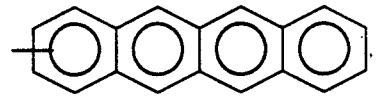

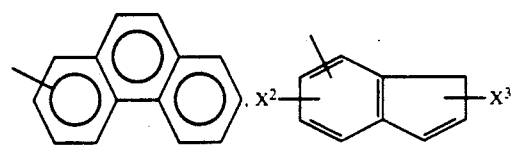

(in which $X^2$ is H or $OCH_3$, and $X^3$ is H, $CH_3$,

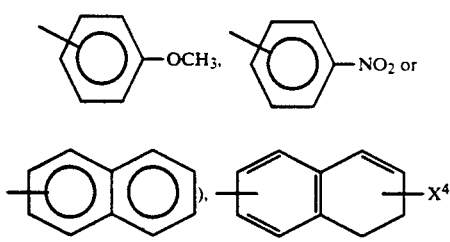

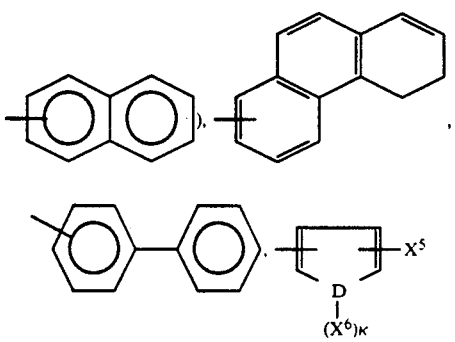

(in which X⁴ is H or

(in which D is O, S, or N,
X⁵ is H or COOH,
X⁶ is H, CH₃, C₂H₅ or

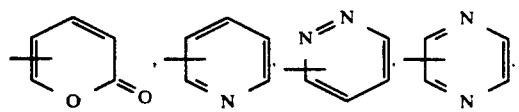

and
κ is 0 or 1),

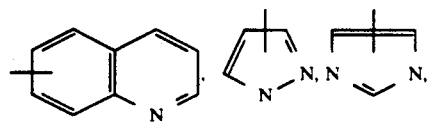

(in which X⁷ is H or O),

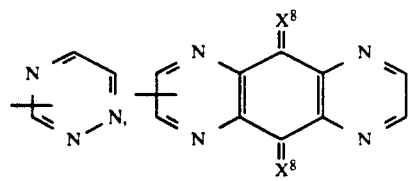

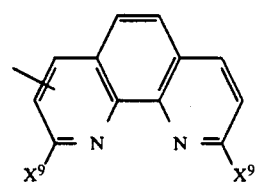

(in which X⁸ is O or C(CN)₂),

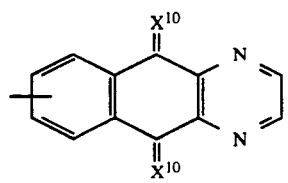

(in which X⁹ is H or CH₃),

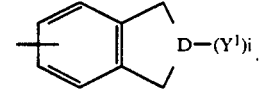

(in which X¹⁰ is O or C(CN)₂),

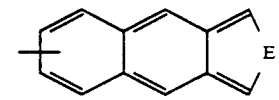

(in which
D is O, S or N,
Y¹ is H, and
i is 0 or 1),

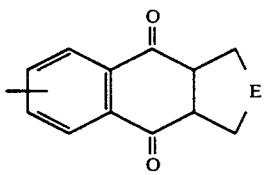

(in which E is O or S), (in which E is O or S),

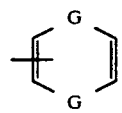

(in which G is S or NH),

(in which Z represents:
(1) substituted or unsubstituted (C₄-C₆) cycloalkenes containing at least one double bond in the ring, (2) (C4–C6) cycloalkenes having an aromatic ring and containing one double bond in the ring,
(3) 5- or 9-membered heterocycles containing a double bond and at least one oxygen in the ring,
(4) 5-membered heterocycles having an aromatic ring, and containing one oxygen and at least one double bond in the ring,
(5) 6- or 7-membered heterocycles having C4 or C6 cycloalkene with at least one double bond, and containing two oxygen atoms in the ring,
(6) C5, C6 or C11 heterocycles containing 1 or 2 sulfur atoms in the ring,
(7) 5- or 6-membered heterocycles containing 2 to 4 nitrogen atoms and at least one double bond in the ring,
(8) 5-, 6- or 8-membered heterocycles having an aromatic ring, and containing at least one double bond and 1 or 2 nitrogen atoms in the ring, or
(9) 5- or 6-membered heterocycles containing 1 or 2 nitrogen atoms and, optionally, oxygen atom in the ring;

Ar represents

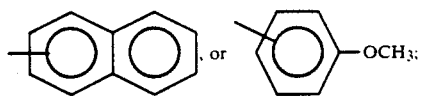

m represents an integer of 1 to 6; and
n represents an integer of 1 to 6.

2. An electroluminescent device according to claim 1, wherein at least one selected from the group consisting of electron transporting layer and hole transporting layer is further disposed between the anode and the cathode.

3. An electroluminescent device according to claim 1, wherein B represents

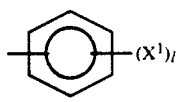

(wherein $X^1$ and l are the same as defined above),

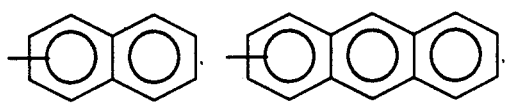

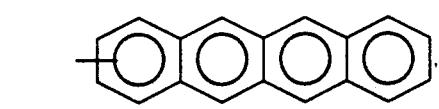

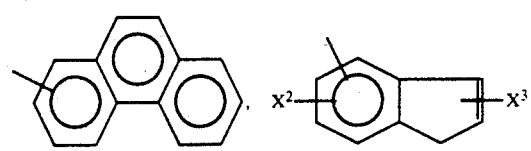

(wherein $X^2$ and $X^3$ are the same as defined above),

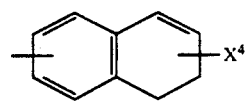

(wherein $X^4$ is the same as defined above),

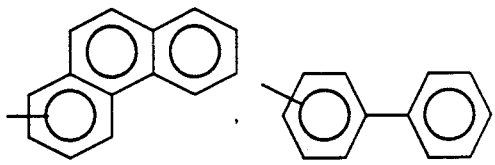

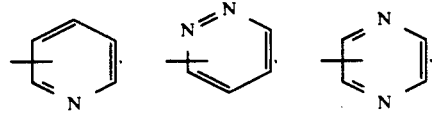

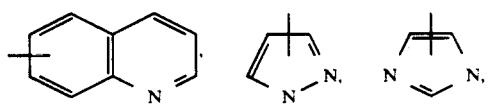

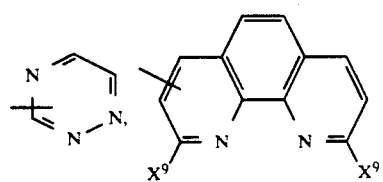

(wherein $X^9$ is the same as defined above),

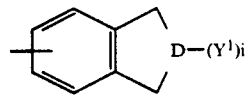

(wherein D, $Y^1$ and i are the same as defined above),

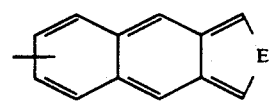

(wherein E is the same as defined above), or Z (which represents (1) substituted or unsubstituted (C4–C6) cycloalkenes containing at least one double bond in the ring or (2) (C4–C6) cycloalkenes having an aromatic ring and containing one double bond in the ring).

4. An electroluminescent device according to claim 1, wherein the thickness of the organic compound layer is not more than 2 μm.

5. An electroluminescent device according to claim 1, wherein said organic compound is selected from the group consisting of the compounds represented by the following formula:

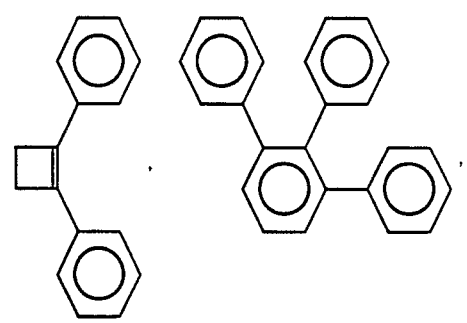
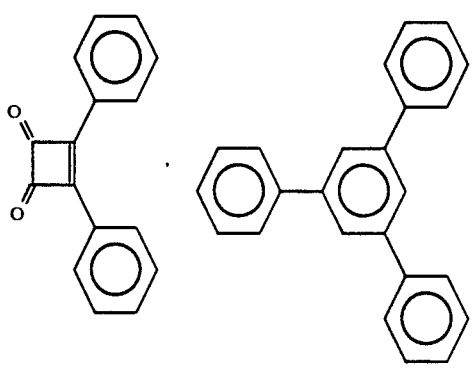
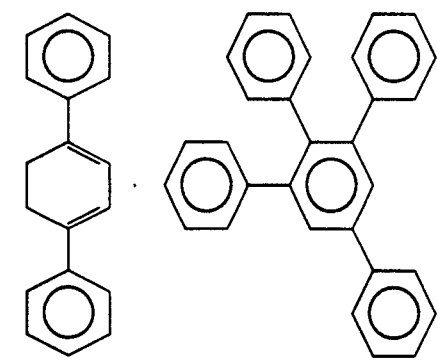
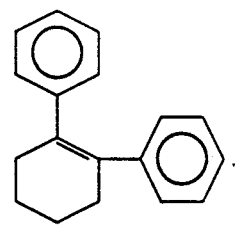
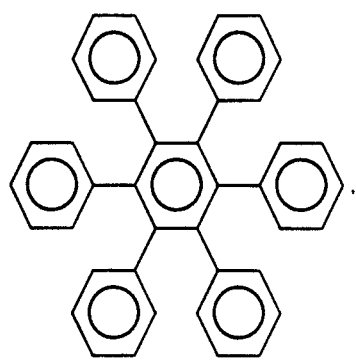
-continued
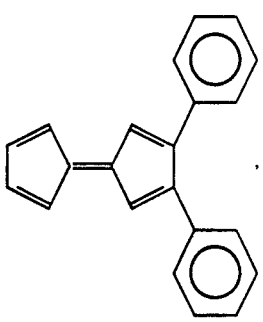
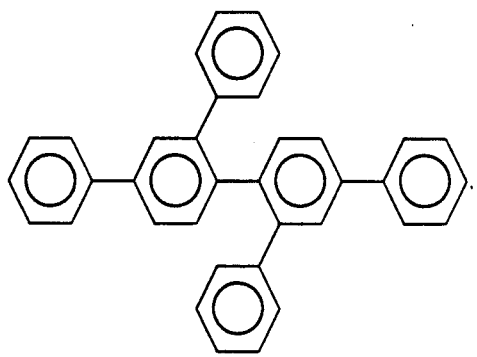
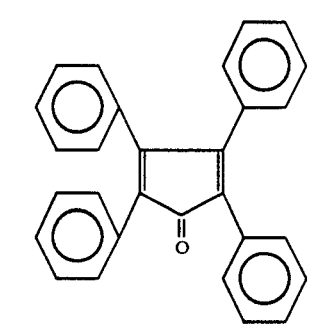
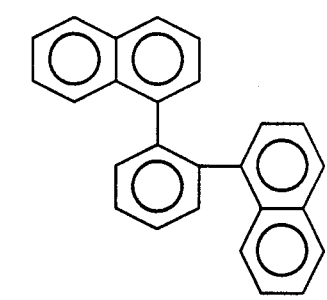
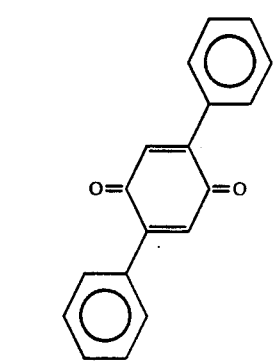

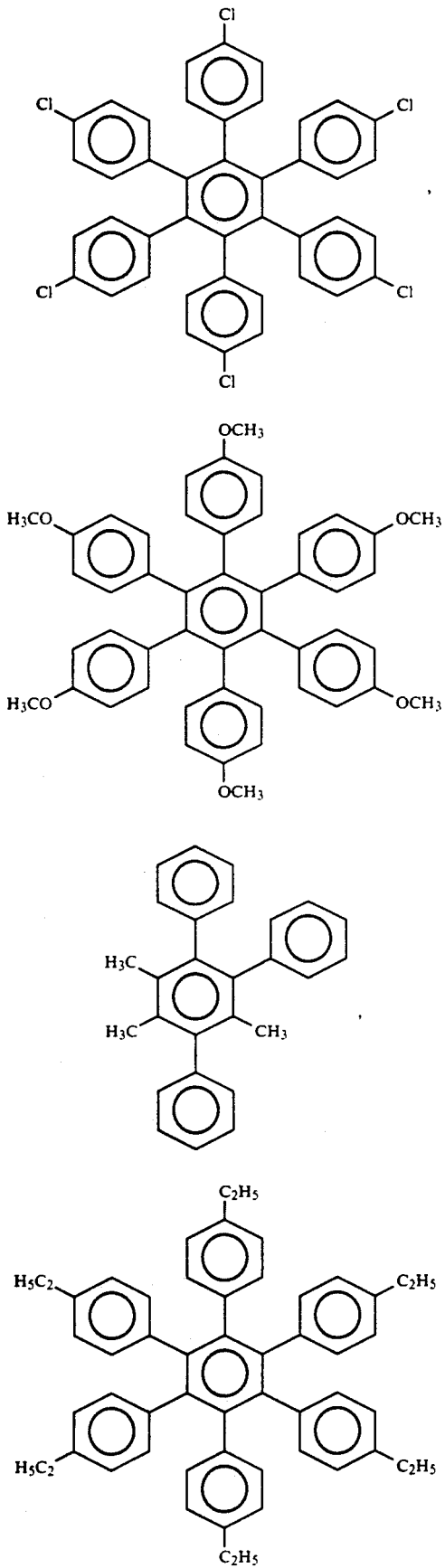
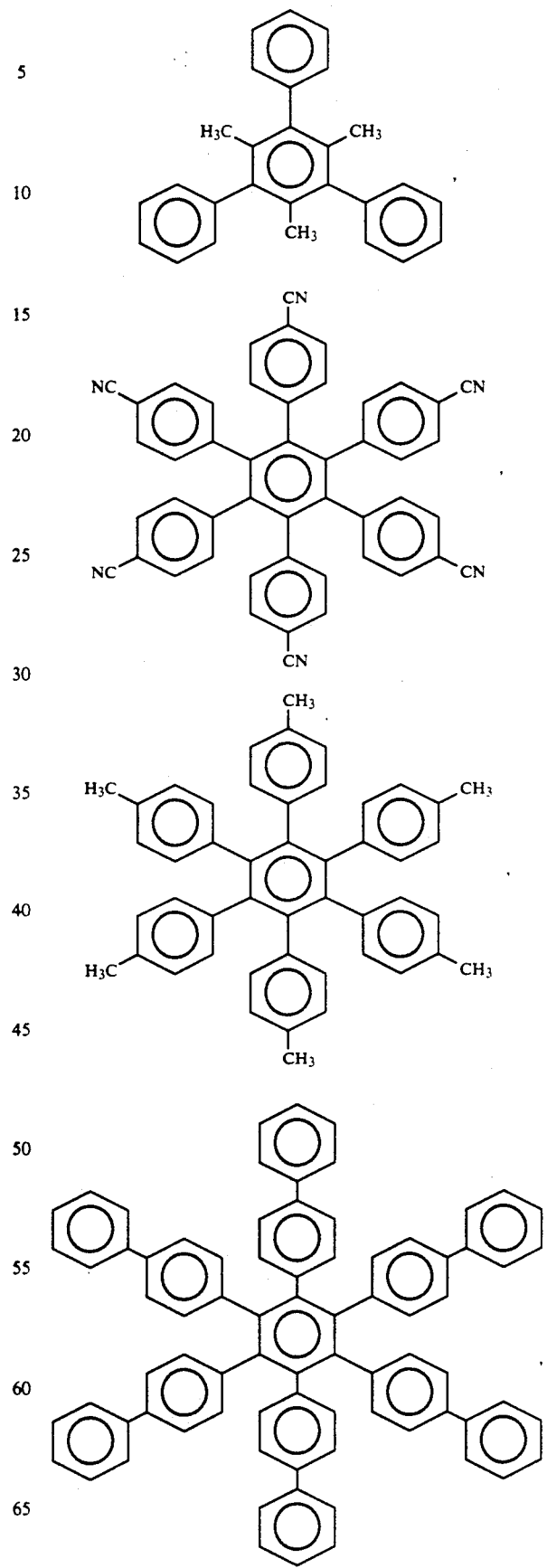

-continued
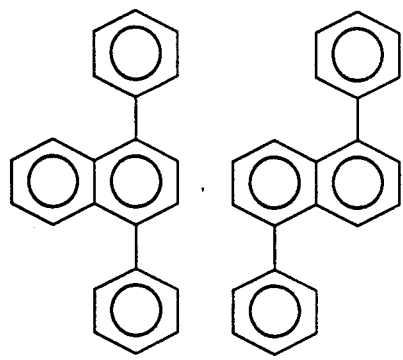
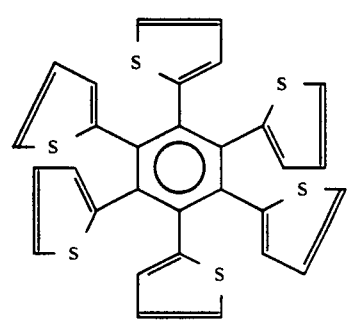
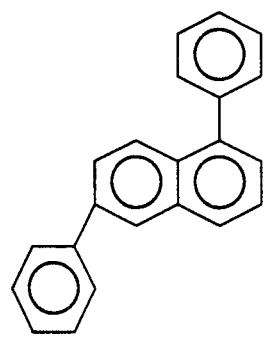
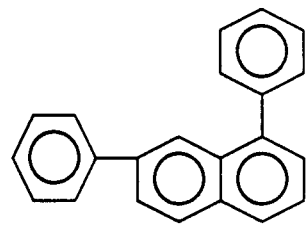
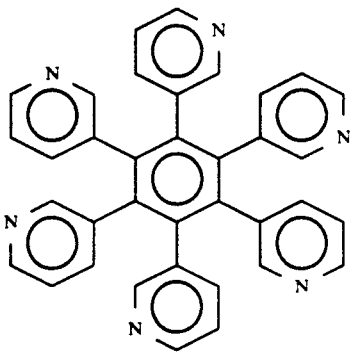
-continued
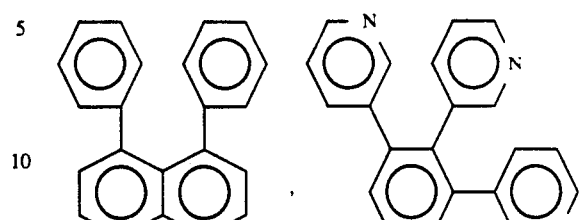
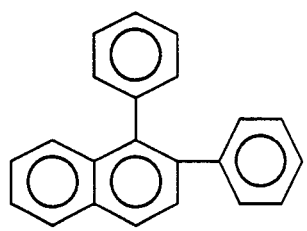
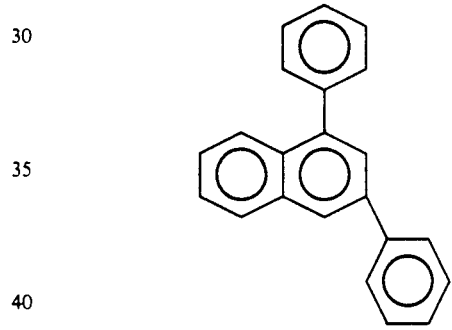
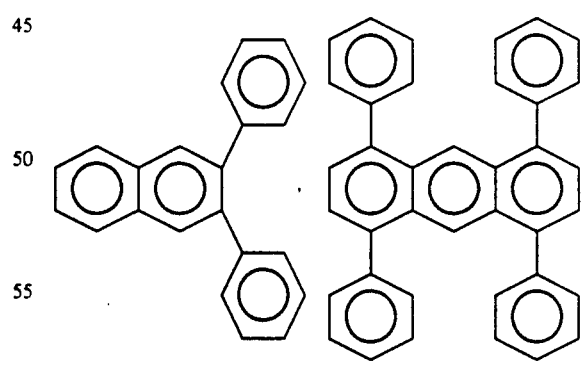
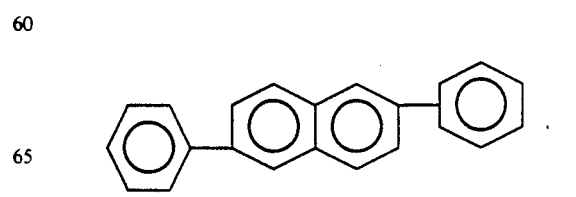

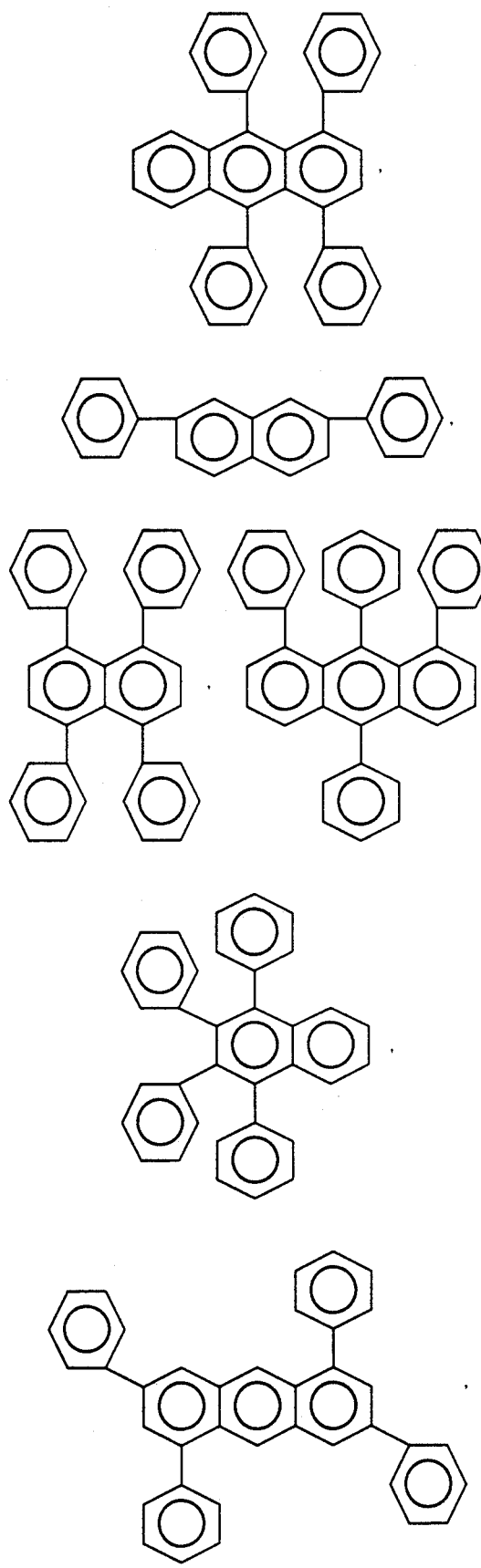
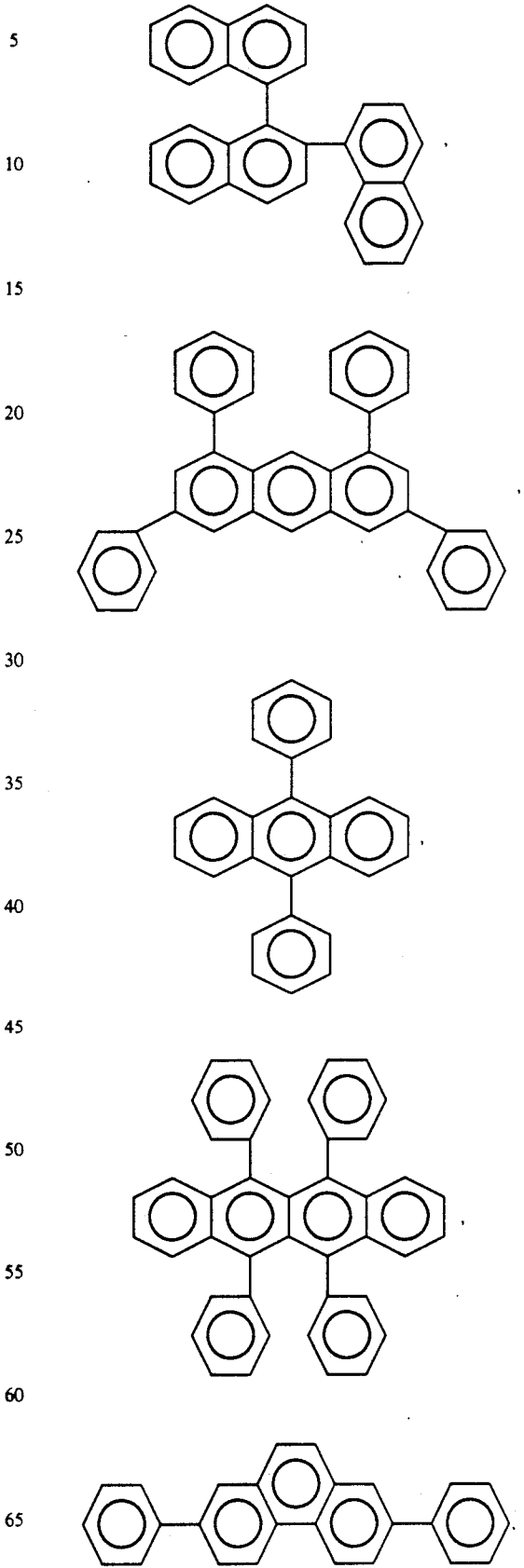

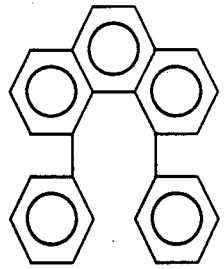
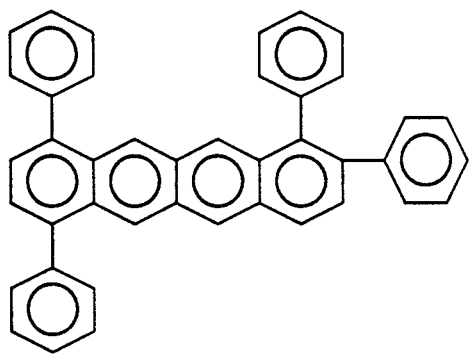
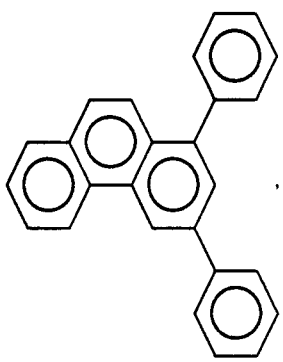
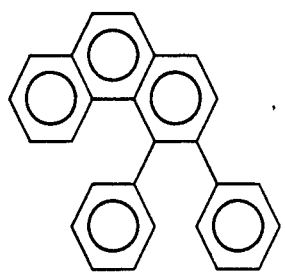
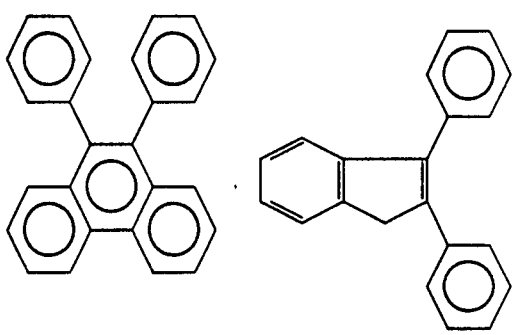
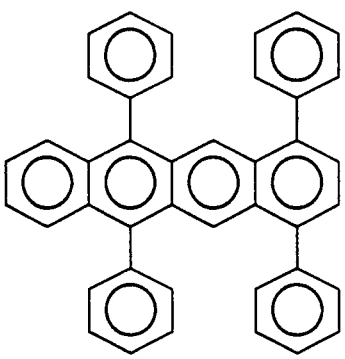
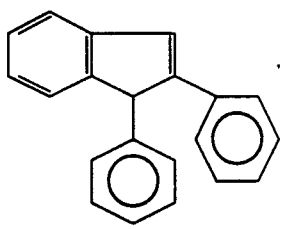
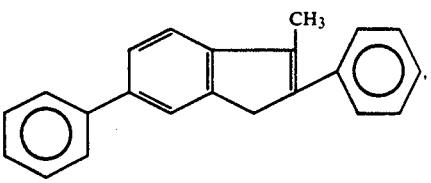
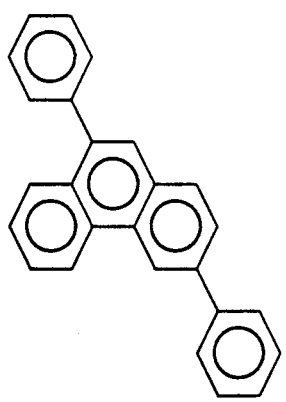
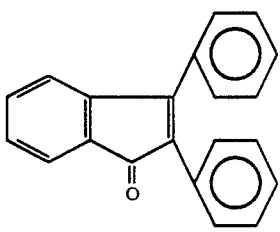

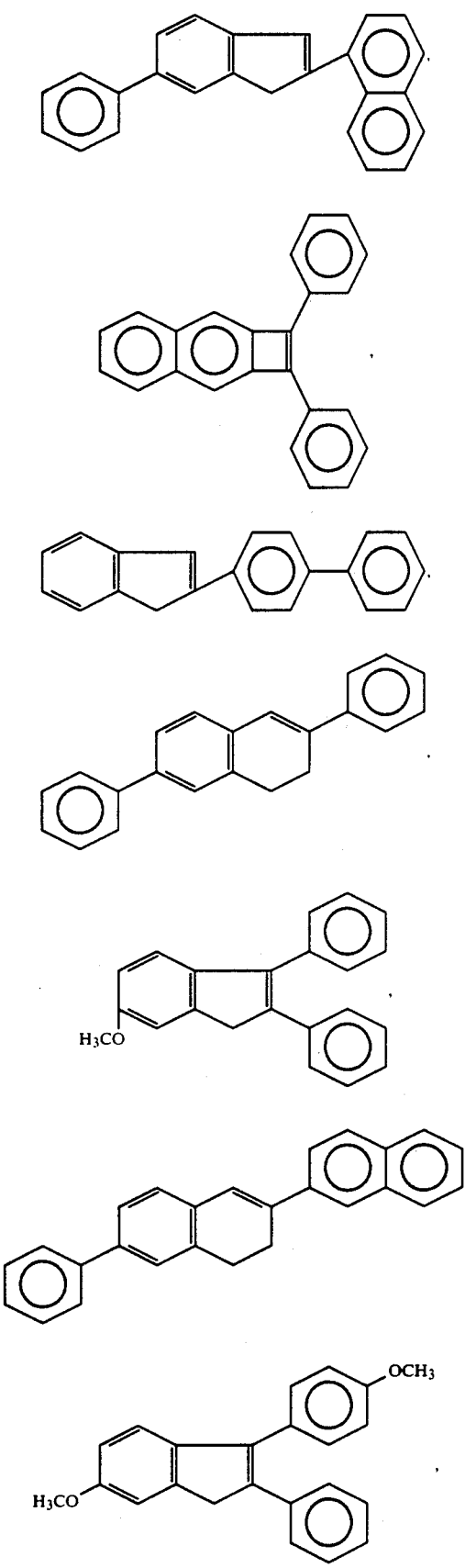
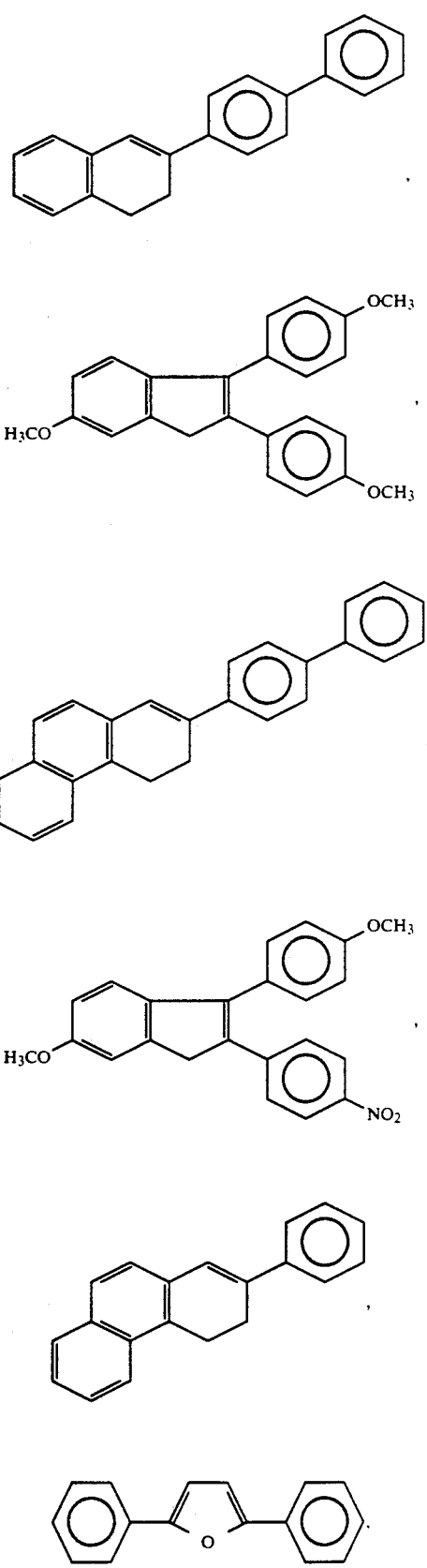

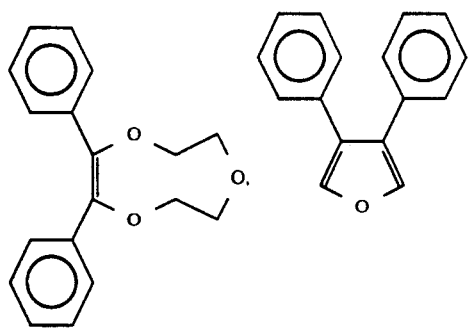
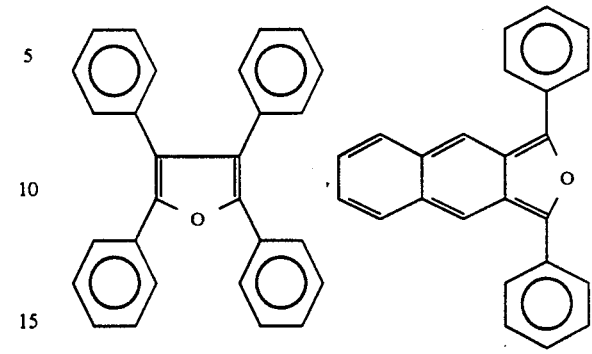
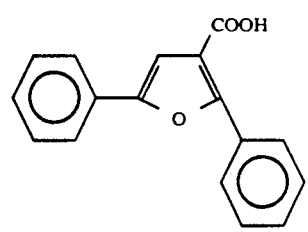
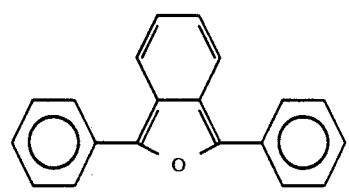
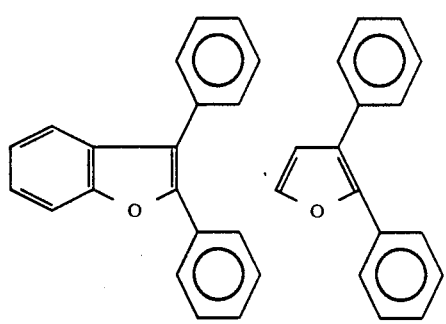
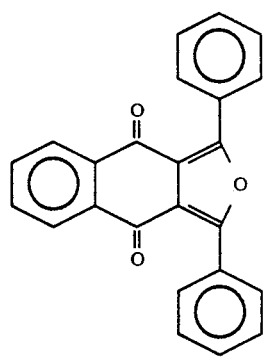
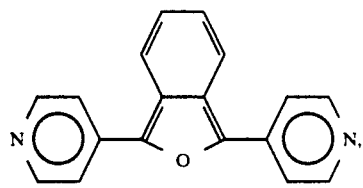
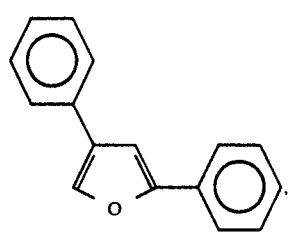
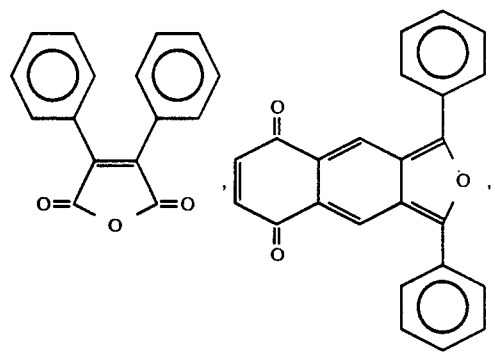
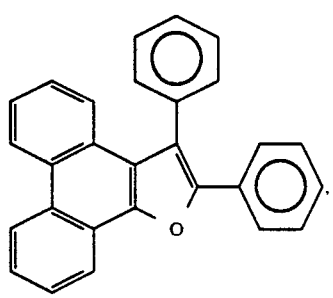
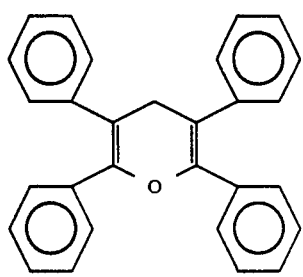

-continued
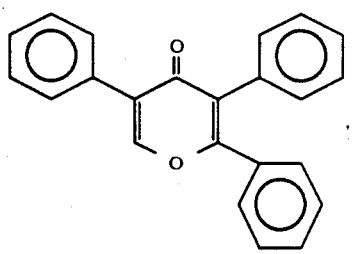
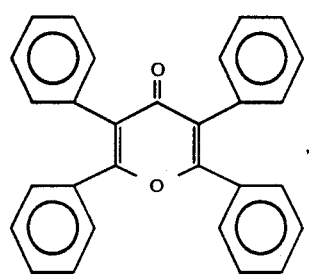
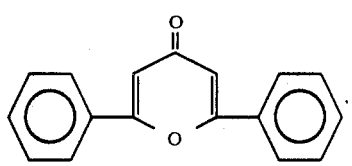
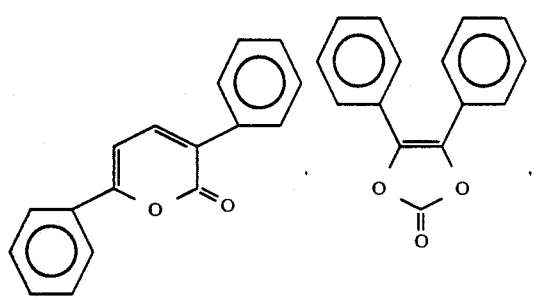
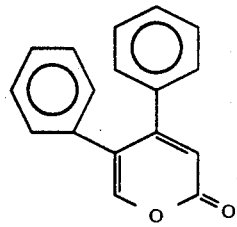
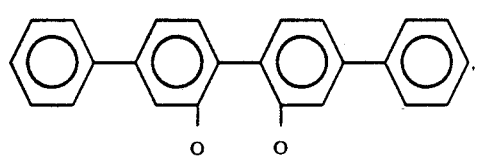
-continued
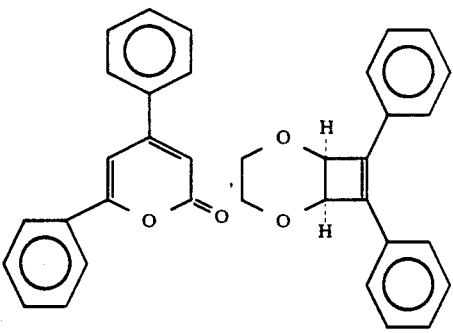
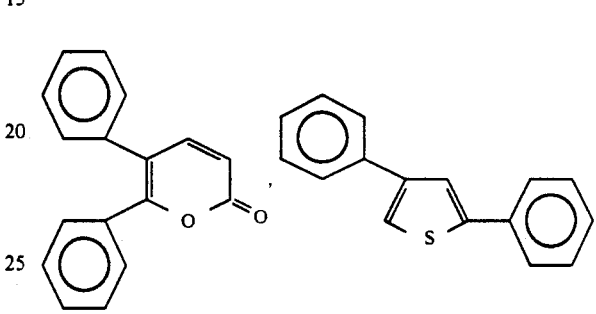
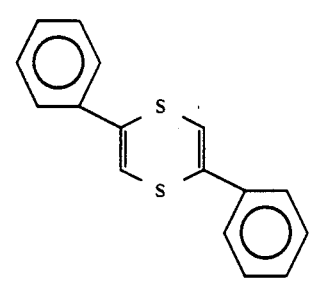
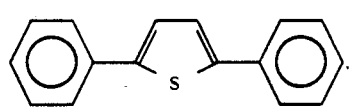
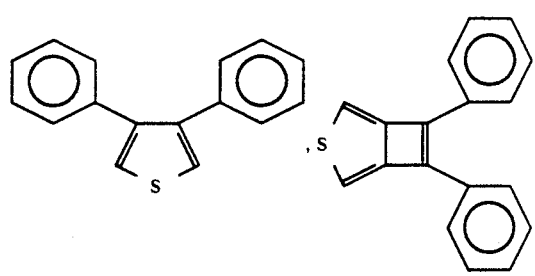
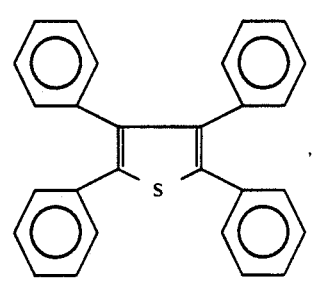

103
-continued
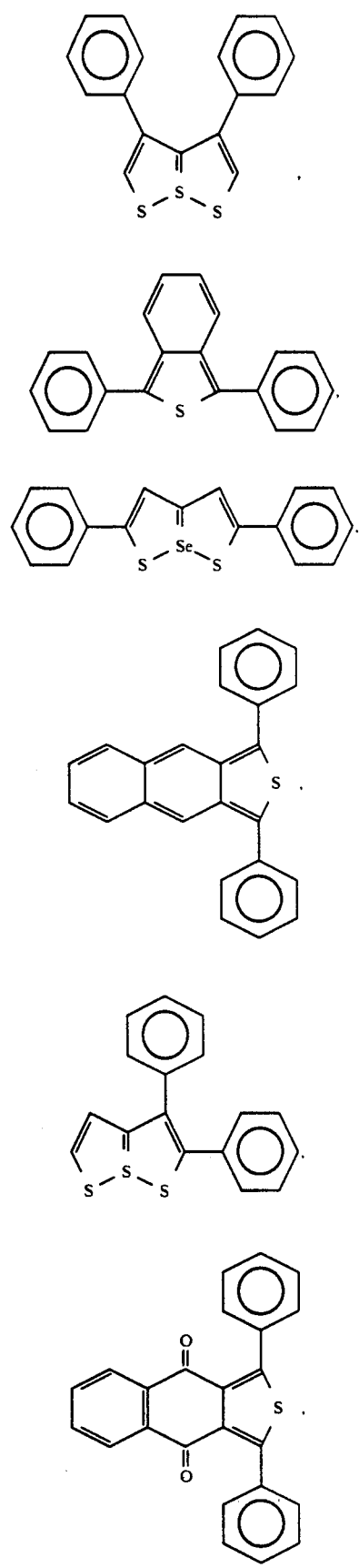
104
-continued
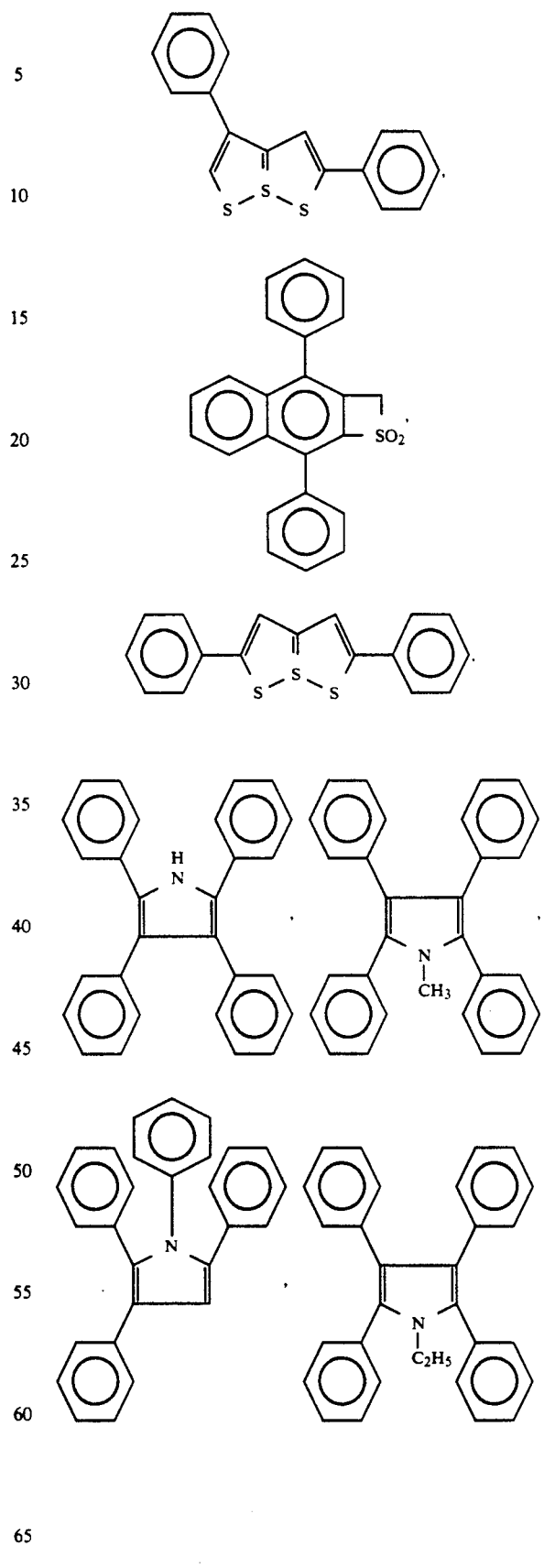

-continued
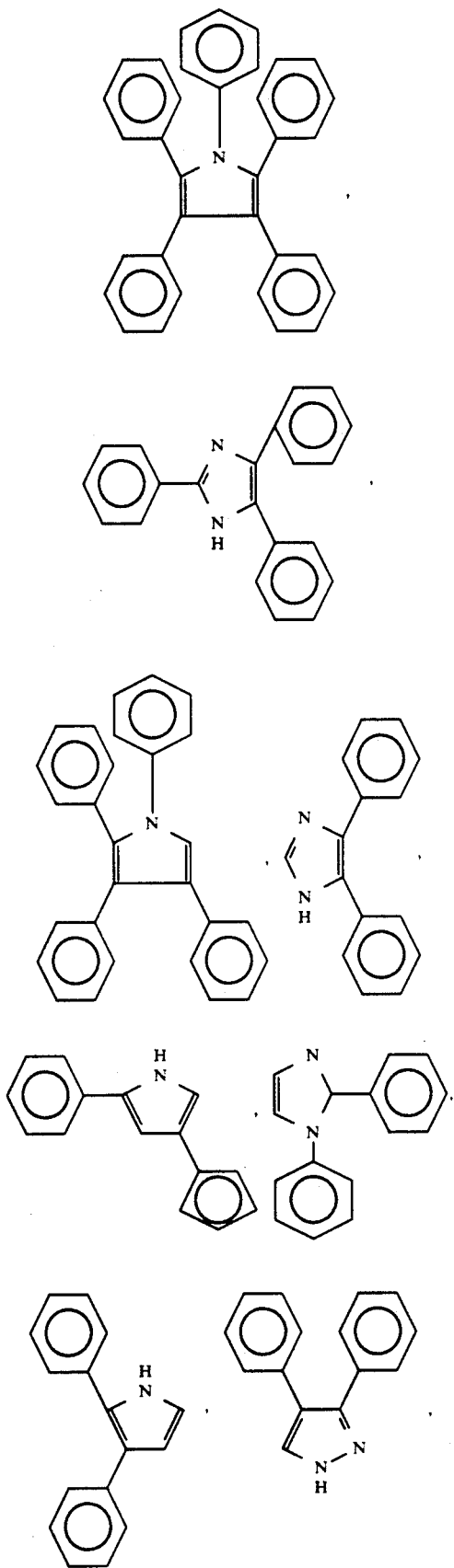
-continued
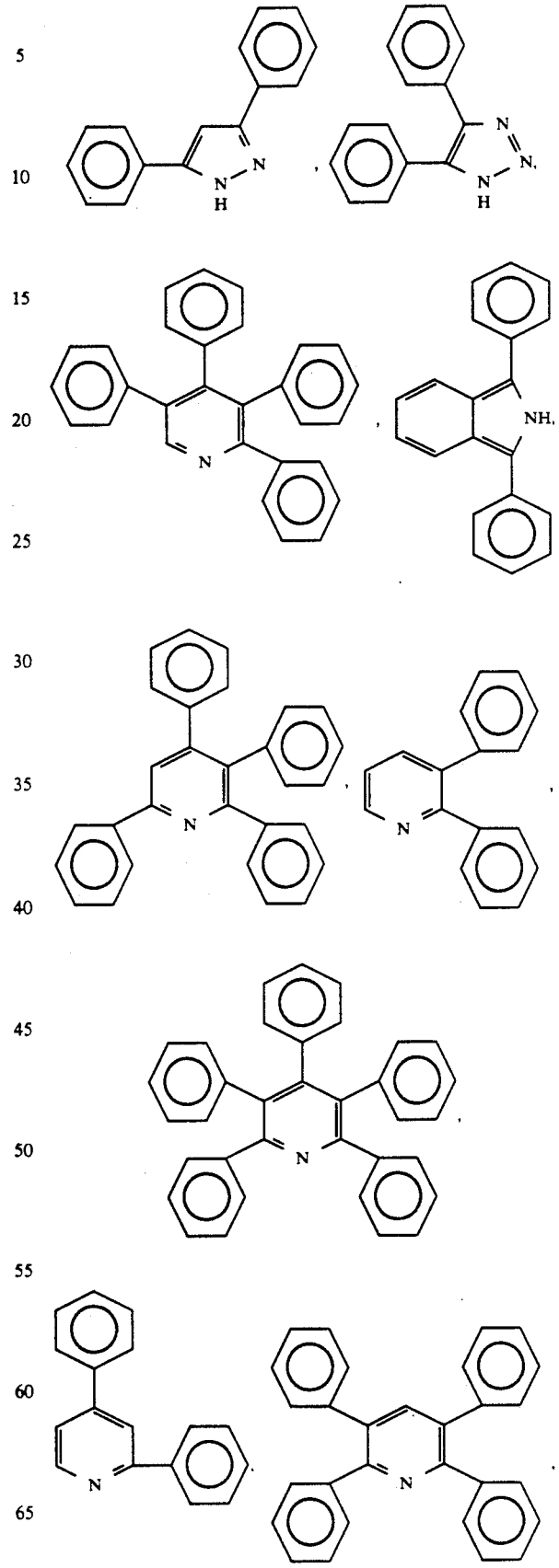

107
-continued
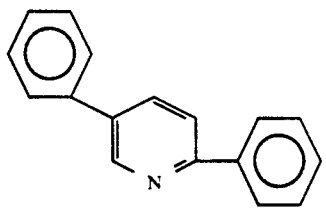
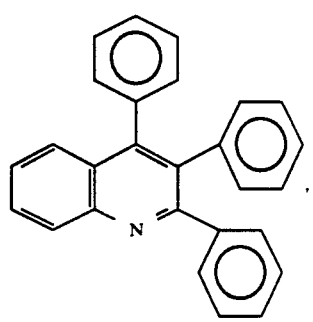
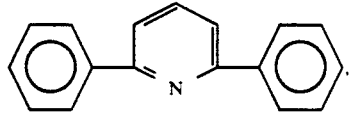
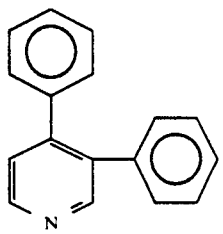
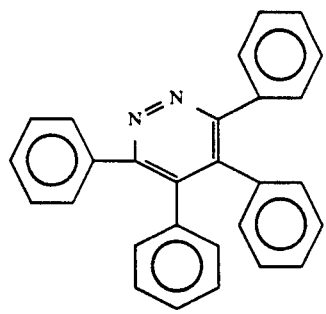
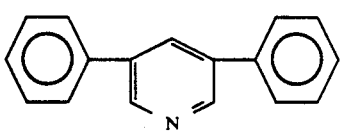
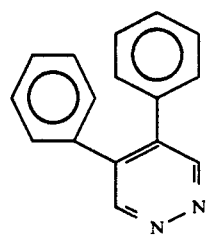
108
-continued
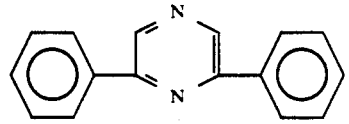
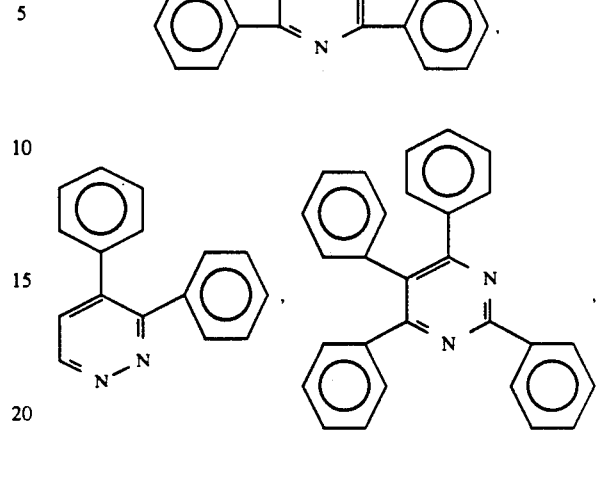
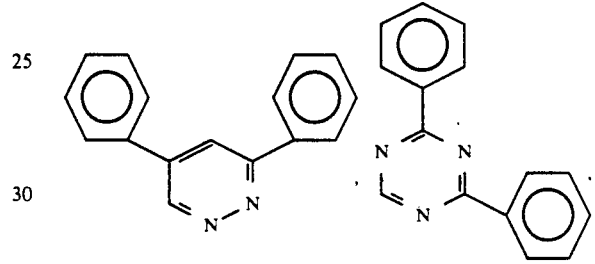
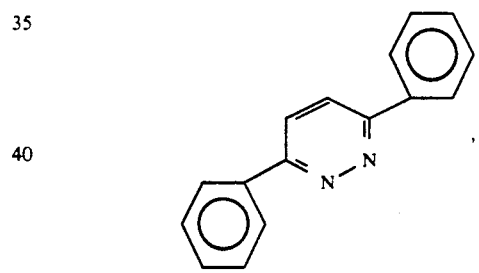
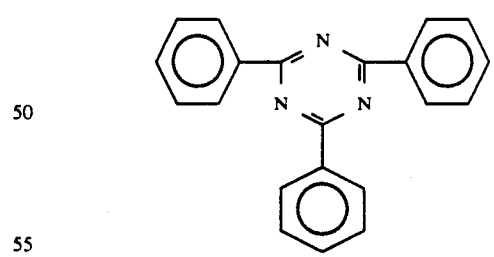
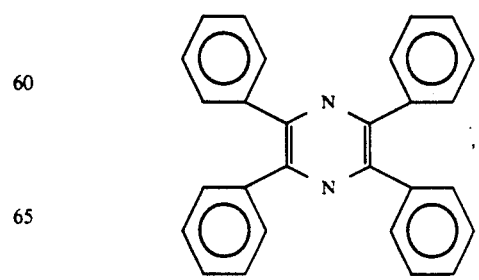

-continued
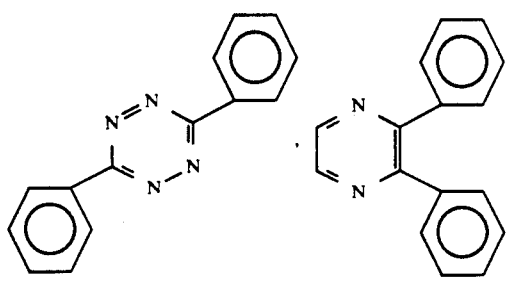
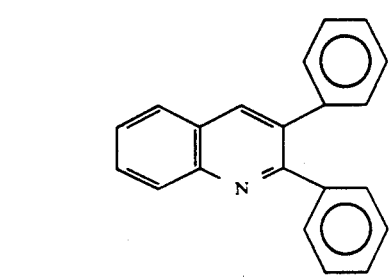
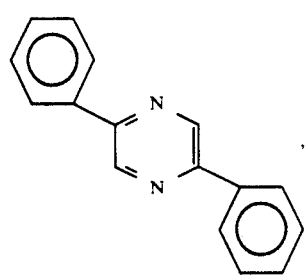
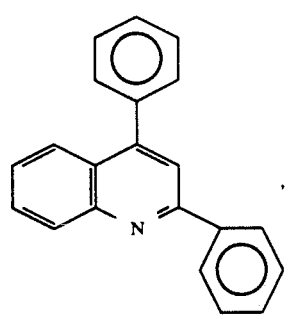
-continued
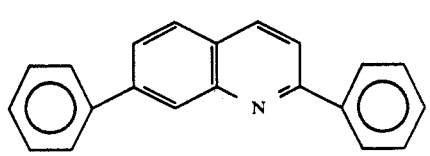
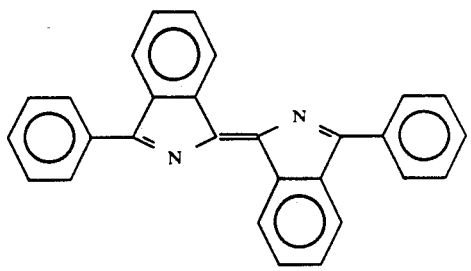
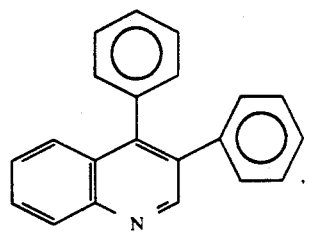
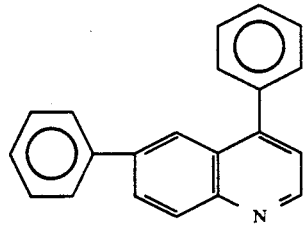
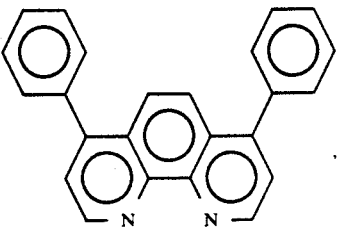

-continued
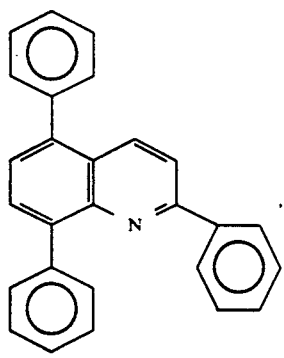
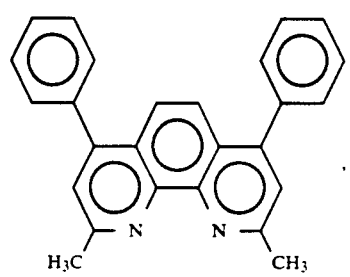
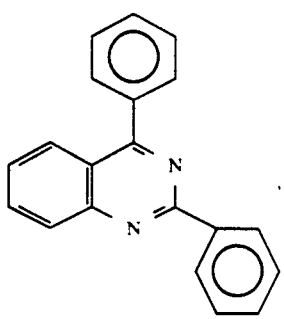
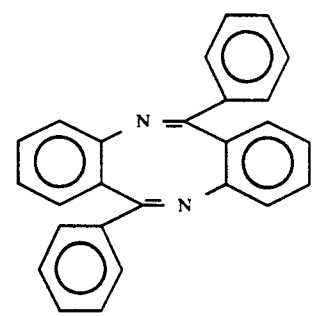
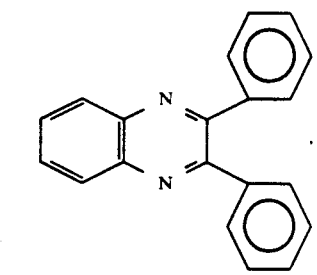
-continued
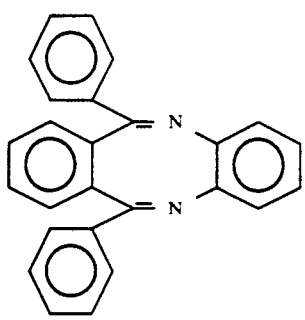
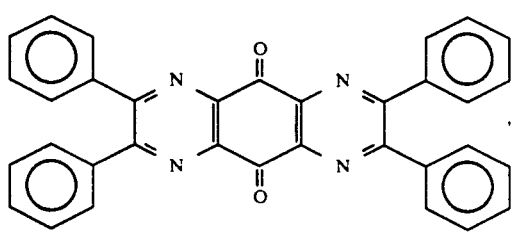
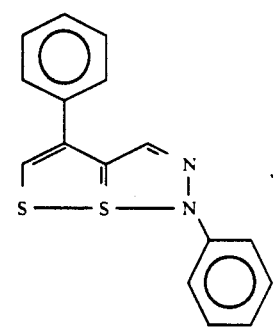
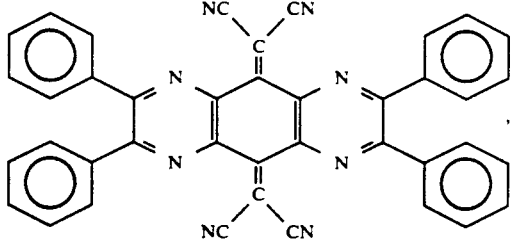
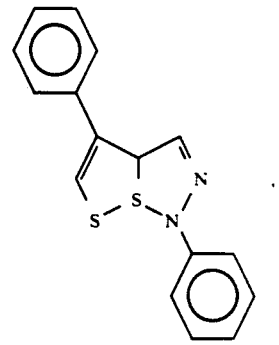

113
-continued
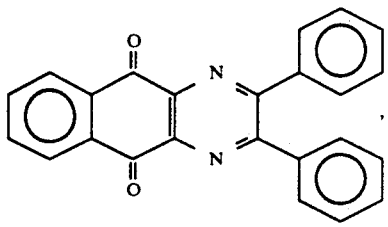
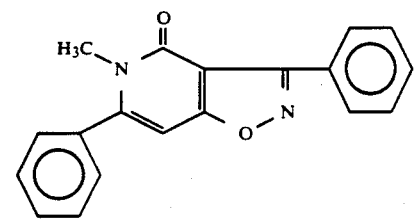
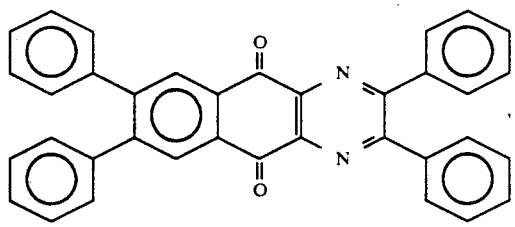
114
-continued
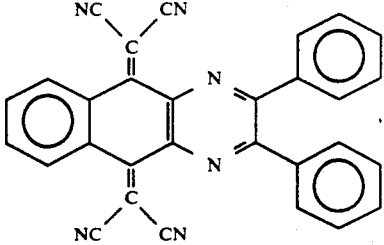
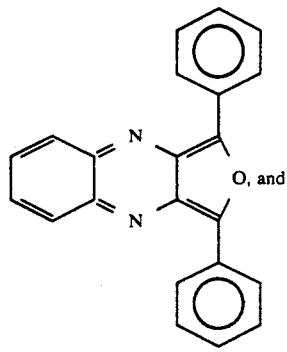
O, and
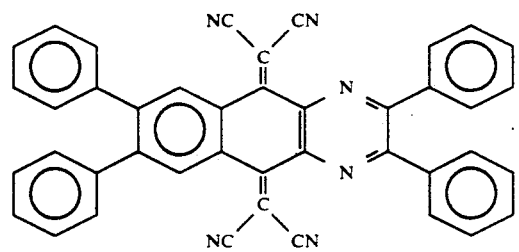
* * * * *

UNITED STATES PATENT AND TRADEMARK OFFICE
CERTIFICATE OF CORRECTION

PATENT NO. : 5,077,142

DATED : DECEMBER 31, 1991

INVENTOR(S) : YOHTA SAKON ET AL

It is certified that error appears in the above-identified patent and that said Letters Patent is hereby corrected as shown below:

Columns 71 and 72, Figure 159, delete " 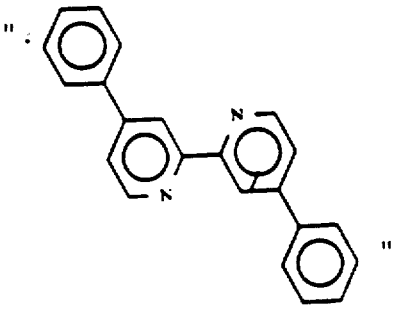 "

and insert -- 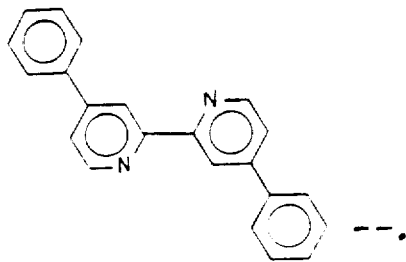 --.

UNITED STATES PATENT AND TRADEMARK OFFICE
CERTIFICATE OF CORRECTION

PATENT NO. : 5,077,142
DATED : DECEMBER 31, 1991
INVENTOR(S) : YOHTA SAKON ET AL

It is certified that error appears in the above-identified patent and that said Letters Patent is hereby corrected as shown below:

Column 110, lines 5-15, delete " 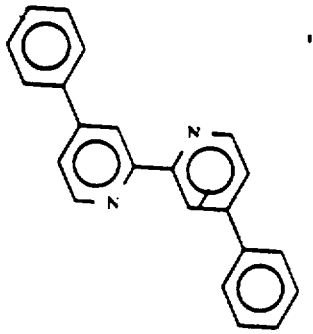 "

and insert -- 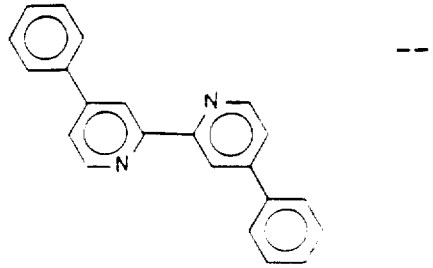 --

UNITED STATES PATENT AND TRADEMARK OFFICE
CERTIFICATE OF CORRECTION

PATENT NO. : 5,077,142

DATED : DECEMBER 31, 1991

INVENTOR(S) : YOHTA SAKON ET AL

It is certified that error appears in the above-identified patent and that said Letters Patent is hereby corrected as shown below:

Column 84, line 45, delete " 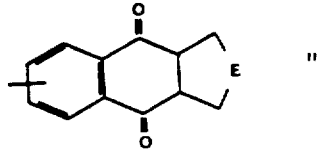 "

and insert -- 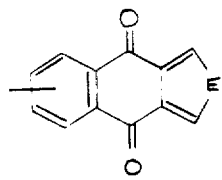 --.

Signed and Sealed this

Twenty-first Day of September, 1993

Attest:

BRUCE LEHMAN

Attesting Officer

Commissioner of Patents and Trademarks